United States Patent
Shang et al.

(10) Patent No.: US 12,101,981 B2
(45) Date of Patent: Sep. 24, 2024

(54) DISPLAY SUBSTRATE, METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tinghua Shang, Beijing (CN); Yi Zhang, Beijing (CN); Haigang Qing, Beijing (CN); Zhengwei Luo, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO. LTD, Beijing (CN)

( * ) Notice: Subject to any disclaimer, the term of this patent is extended or adjusted under 35 U.S.C. 154(b) by 633 days.

(21) Appl. No.: 17/417,697

(22) PCT Filed: Aug. 31, 2020

(86) PCT No.: PCT/CN2020/112667
§ 371 (c)(1),
(2) Date: Jun. 23, 2021

(87) PCT Pub. No.: WO2022/041237
PCT Pub. Date: Mar. 3, 2022

(65) Prior Publication Data
US 2022/0336540 A1  Oct. 20, 2022

(51) Int. Cl.
*H10K 59/35* (2023.01)
*H10K 59/12* (2023.01)
(Continued)

(52) U.S. Cl.
CPC ....... *H10K 59/353* (2023.02); *H10K 59/1213* (2023.02); *H10K 59/1216* (2023.02);
(Continued)

(58) Field of Classification Search
CPC ............ H10K 59/131; H10K 59/1213; H10K 59/1216; H10K 59/8051; H10K 59/80515
See application file for complete search history.

(56) References Cited

U.S. PATENT DOCUMENTS

2014/0306241 A1    10/2014  Hirakata et al.
2015/0144908 A1*    5/2015  Yoon ..................... H10K 59/35
                                                                257/40

(Continued)

FOREIGN PATENT DOCUMENTS

CN     107819010 A     3/2018
CN     107946337 A     4/2018
(Continued)

OTHER PUBLICATIONS

CN107819010A, English Abstract and U.S. Equivalent U.S. Pub. No. 2018/0076270.
(Continued)

*Primary Examiner* — Ali Naraghi
*Assistant Examiner* — E. Rhett Cheek
(74) *Attorney, Agent, or Firm* — Brooks Kushman P.C.

(57) ABSTRACT

A display substrate, a method for manufacturing the display substrate, and a display device. The display substrate includes a first sub-pixel and a second sub-pixel, the first sub-pixel includes a first data line pattern, and the second sub-pixel includes a second data line pattern, a second electrode of the sixth transistor in the first sub-pixel is electrically connected to the anode pattern through the third conductive connection portion and the fourth conductive connection portion; in the first sub-pixel, an orthographic
(Continued)

projection of the anode pattern on the substrate at least partially overlaps an orthographic projection of the second data line pattern on the substrate, and the orthographic projection of the anode pattern on the substrate at least partially overlaps an orthographic projection of a data line pattern adjacent to the second data line pattern along the first direction on the substrate.

19 Claims, 23 Drawing Sheets

(51) Int. Cl.
*H10K 59/121* (2023.01)
*H10K 59/126* (2023.01)
*H10K 59/131* (2023.01)

(52) U.S. Cl.
CPC ......... *H10K 59/126* (2023.02); *H10K 59/131* (2023.02); *H10K 59/351* (2023.02); *H10K 59/1201* (2023.02)

(56) References Cited

U.S. PATENT DOCUMENTS

| | | | |
|---|---|---|---|
| 2018/0062107 A1* | 3/2018 | Kim | H10K 59/131 |
| 2018/0076270 A1 | 3/2018 | Kwon et al. | |
| 2018/0102381 A1 | 4/2018 | Chen et al. | |
| 2018/0159065 A1 | 6/2018 | Kim | |
| 2018/0342570 A1* | 11/2018 | Hong | H10K 59/123 |
| 2019/0064552 A1 | 2/2019 | Kim et al. | |
| 2020/0335561 A1 | 10/2020 | Huang et al. | |
| 2021/0111239 A1* | 4/2021 | Cho | H10K 59/126 |
| 2022/0320218 A1* | 10/2022 | Ka | H10K 59/1216 |
| 2024/0090298 A1* | 3/2024 | Jang | H10K 59/122 |

FOREIGN PATENT DOCUMENTS

| | | | |
|---|---|---|---|
| CN | 108133952 A | 6/2018 |
| CN | 109427854 A | 3/2019 |
| CN | 109671760 A | 4/2019 |
| CN | 109786434 A | 5/2019 |
| CN | 110047898 A | 7/2019 |
| CN | 110610980 A | 12/2019 |
| CN | 111584599 A | 8/2020 |

OTHER PUBLICATIONS

CN107946337A, English Abstract and U.S. Equivalent U.S. Pub. No. 2018/0102381.
CN108133952A, English Abstract and U.S. Equivalent U.S. Pub. No. 2018/0159065.
CN109427854A, English Abstract and U.S. Equivalent U.S. Pub. No. 2018/0064552.
CN109671760A, English Abstract and U.S. Equivalent U.S. Pub. No. 2018/0335561.
CN109786434A, English Abstract and Machine Translation.
CN110047898A, English Abstract and Machine Translation.
CN110610980A, English Abstract and Machine Translation.
CN111584599A, English Abstract and Machine Translation.

* cited by examiner

DISPLAY SUBSTRATE, METHOD FOR MANUFACTURING THE SAME, AND DISPLAY DEVICE

CROSS-REFERENCE TO RELATED APPLICATION

This application is the U.S. national phase of PCT Application No. PCT/CN2020/112667 filed on Aug. 31, 2020, which is incorporated herein by reference in its entirety.

TECHNICAL FIELD

The present disclosure relates to the field of display technology, in particular to a display substrate, a method for manufacturing the same and a display device.

BACKGROUND

Active-matrix Organic Light emitting Diode (AMOLED) display device is currently a very popular display due to its advantages such as self-luminescence, ultra-thin, fast response, high contrast, wide viewing angle, etc. Such an AMOLED display device includes a plurality of pixel driving circuits and a plurality of light emitting elements, and the pixel driving circuit is used to drive a corresponding light emitting element to emit light, thereby realizing the display function of the AMOLED display device.

When the pixel driving circuit drives the light emitting element to emit light, there are a low-frequency driving mode and high-frequency driving mode. When the low-frequency driving mode is adopted to drive the light emitting element, the data writing time of each row of pixel drive circuit control pixels is longer, and when the high-frequency driving mode is adopted to drive the light emitting element, the data writing time of each row of pixels is reduced, so that the data writing time of each row of pixel driving circuit control pixels is shorter.

SUMMARY

The present disclosure provides a display substrate, a method for manufacturing the same and a display device.

In a first aspect, the present disclosure provides in some embodiments a display substrate, including: a substrate and a plurality of sub-pixels arranged in an array on the substrate, wherein the plurality of sub-pixels includes: a first sub-pixel and a second sub-pixel arranged along a second direction, the first sub-pixel includes a first data line pattern, and the second sub-pixel includes a second data line pattern, the first data line pattern is configured to provide a first data signal to the first sub-pixel, and the second data line pattern is configured to provide a second data signal to the second sub-pixel; at least part of the first data line pattern and at least part of the second data line pattern extend along the second direction, and the first data line pattern is located on a first side of a same column of first sub-pixels extending along the second direction, the second data line pattern is located on a second side of a same column of the second sub-pixels extending along the second direction; the first side and the second side is opposite to each other along a first direction, and the first direction intersects the second direction; the first sub-pixel includes a sixth transistor, and a third conductive connecting portion, a fourth conductive connecting portion, and an anode pattern stacked in a direction away from the substrate; a second electrode of the sixth transistor is electrically connected to the anode pattern through the third conductive connection portion and the fourth conductive connection portion; in the first sub-pixel, an orthographic projection of the anode pattern on the substrate at least partially overlaps an orthographic projection of the second data line pattern on the substrate, and the orthographic projection of the anode pattern on the substrate at least partially overlaps an orthographic projection of a data line pattern adjacent to the second data line pattern along the first direction on the substrate.

Optionally, in the first sub-pixel, the anode pattern does not overlap the first data line pattern.

Optionally, the second sub-pixel includes a sixth transistor, and a third conductive connection portion, a fourth conductive connection portion and an anode pattern stacked in a direction away from the substrate; a second electrode of the sixth transistor is electrically connected to the anode pattern through the third conductive connection portion and the fourth conductive connection portion; in the second sub-pixel, the fourth conductive connection portion includes a solid portion and a hollow portion; an orthographic projection of the anode pattern on the substrate at least partially overlaps an orthographic projection of the first data line pattern on the substrate, and at least partially an the orthographic projection of a data line pattern adjacent to the first data line pattern along the first direction on the substrate; the orthographic projection of the anode pattern on the substrate at least partially overlaps the orthographic projection of the second data line pattern on the substrate, and at least partially overlaps an orthographic projection of the solid portion on the substrate and an orthographic projection of the hollow portion on the substrate, respectively.

Optionally, the plurality of sub-pixels further includes: a third sub-pixel and a fourth sub-pixel arranged along the second direction, along the first direction, the third sub-pixel and the first sub-pixel are located in a same row, and the fourth sub-pixel and the second sub-pixel are located in a same row; the third sub-pixel includes a third data line pattern, the fourth sub-pixel includes a fourth data line pattern, at least part of the third data line pattern and at least part of the fourth data line pattern extend along the second direction, the third data line pattern is located on a second side of a same columns of third sub-pixels extending along the second direction, and the fourth data line pattern is located on a first side of a same column of fourth sub-pixels extending along the second direction; the third sub-pixel includes a sixth transistor, and a third conductive connecting portion, a fourth conductive connecting portion, and an anode pattern stacked in a direction away from the substrate; a second electrode of the sixth transistor is electrically connected to the anode pattern through the third conductive connection portion and the fourth conductive connection portion; in the third sub-pixel, the fourth conductive connection portion includes a solid portion and a hollow portion; an orthographic projection of the anode pattern on the substrate at least partially overlaps an orthographic projection of the solid portion on the substrate and an orthographic projection of the hollow portion on the substrate, respectively; the orthographic projection of the anode pattern on the substrate at least partially overlaps an orthographic projection of the third data line pattern on the substrate, and at least partially overlaps an orthographic projection of a data line pattern adjacent to the third data line pattern along the first direction on the substrate.

Optionally, the fourth sub-pixel includes a sixth transistor, and a third conductive connection portion, a fourth conductive connection portion and an anode pattern stacked in a direction away from the substrate; a second electrode of the sixth transistor is electrically connected to the anode pattern through the third conductive connection portion and the fourth conductive connection portion; in the fourth sub-pixel, the fourth conductive connection portion includes a solid portion and a hollow portion; an orthographic projection of the anode pattern on the substrate at least partially overlaps an orthographic projection of the solid portion on the substrate; the orthographic projection of the anode pattern on the substrate at least partially overlaps with an orthographic projection of the third data line pattern on the substrate, and at least partially overlaps an orthographic projection of a data line pattern adjacent to the third data line pattern along the first direction on the substrate.

Optionally, in the fourth sub-pixel, the orthographic projection of the anode pattern on the substrate does not overlap an orthographic projection of the fourth data line pattern on the substrate.

Optionally, the first sub-pixel, the second sub-pixel, the third sub-pixel and the fourth sub-pixel each include: a power signal line pattern, at least part of the power signal line pattern extends along the second direction; a power compensation pattern, at least part of the power compensation pattern extends along the first direction, and the power signal line pattern and the power compensation pattern are both located a side of the first data line pattern, the second data line pattern, the third data line pattern and the fourth data line pattern close to the substrate, the power compensation pattern is electrically connected to the power signal line pattern and a power signal line pattern in an adjacent sub-pixel along the first direction.

Optionally, the first sub-pixel, the second sub-pixel, the third sub-pixel, and the fourth sub-pixel each include: a reset signal line pattern, a gate line pattern and a light emitting control signal line pattern arranged along the second direction; at least part of the reset signal line pattern extends along the first direction, and at least part of the gate line pattern extends along the first direction, at least part of the light emitting control signal line pattern extends along the first direction; in the first sub-pixel, the second sub-pixel, the third sub-pixel, and the fourth sub-pixel, an orthographic projection of the power compensation pattern on the substrate is located between an orthographic projection of the gate line pattern on the substrate and an orthographic projection of the light emitting control signal line pattern on the substrate.

Optionally, in the first sub-pixel, the second sub-pixel, the third sub-pixel, and the fourth sub-pixel, the power signal line pattern in each sub-pixel includes: a power main body and a power protruding portion that are electrically connected, at least part of the power protruding portion extends along the second direction, there is a gap between the power protruding portion and the power main body; a first end of the power compensation pattern is electrically connected to a power protruding portion in a sub-pixel to which the power compensation pattern belongs; a second end of the power compensation pattern is electrically connected to a power main body in an adjacent sub-pixel along the first direction.

Optionally, in the first sub-pixel, the orthographic projection of the power protruding portion on the substrate overlaps the orthographic projection of the first data line pattern on the substrate, and the orthographic projection of the power main body on the substrate at least partially overlaps an orthographic projections of an adjacent data line pattern along the first direction on the substrate.

Optionally, in the second sub-pixel, the orthographic projection of the power protruding portion on the substrate does not overlap the orthographic projection of the second data line pattern on the substrate.

Optionally, in the third sub-pixel, the orthographic projection of the power protruding portion on the substrate does not overlap the orthographic projection of the third data line pattern on the substrate.

Optionally, in the fourth sub-pixel, the orthographic projection of the power protruding portion on the substrate overlaps the orthographic projection of the fourth data line pattern on the substrate, the orthographic projection of the power main body on the substrate overlaps an orthographic projection of an adjacent data line pattern along the first direction on the substrate.

Optionally, the first sub-pixel, the second sub-pixel, the third sub-pixel and the fourth sub-pixel each include: an initialization signal line pattern, a second transistor, and a second conductive connection portion; at least part of the initialization signal line pattern extends along the second direction, and the initialization signal line pattern is used to transmit an initialization signal; a first electrode of the second transistor is electrically connected to the initialization signal line pattern through the second conductive connection portion, and a second electrode of the second transistor is electrically connected to a gate electrode of the driving transistor; in the first sub-pixel, the orthographic projection of the second conductive connection portion on the substrate overlaps the orthographic projection of the first data line pattern on the substrate; in the second sub-pixel, the orthographic projection of the second conductive connection portion on the substrate does not overlap the orthographic projection of the second data line pattern on the substrate; in the third sub-pixel, the orthographic projection of the second conductive connection portion on the substrate does not overlap the orthographic projection of the third data line pattern on the substrate; in the fourth sub-pixel, the orthographic projection of the second conductive connection portion on the substrate overlaps the orthographic projection of the second data line pattern on the substrate.

Optionally, the first sub-pixel, the second sub-pixel, the third sub-pixel, and the fourth sub-pixel each include: an initialization signal line pattern, a shielding pattern, a driving transistor, a second transistor, in the first sub-pixel, the second sub-pixel, the third sub-pixel, and the fourth sub-pixel, a first electrode of the second transistor is electrically connected to the initialization signal line pattern, and a second electrode of the second transistor is electrically connected to a gate electrode of the driving transistor; the shielding pattern is electrically connected to the power signal line pattern, and an orthographic projection of the shielding pattern on the substrate at least partially overlaps an orthographic projection of the first electrode of the second transistor on the substrate.

Optionally, the first sub-pixel, the second sub-pixel, the third sub-pixel, and the fourth sub-pixel each include: a first conductive connection portion, a fifth conductive connection portion and a data writing transistor; in the first sub-pixel, the second sub-pixel, the third sub-pixel, and the fourth sub-pixel, the second electrode of the second transistor is electrically connected to the gate electrode of the driving transistor through the fifth conductive connection portion; the first conductive connection portion is electrically connected to the first electrode of the data writing transistor; the second electrode of the data writing transistor is electrically connected to the first electrode of the driving transistor; the orthographic projection of the shielding pattern on the substrate at least partially overlaps the orthographic projection of the first conductive connection portion on the substrate.

Optionally, the first sub-pixel, the second sub-pixel, the third sub-pixel, and the fourth sub-pixel each include: a first conductive connection part; in the first sub-pixel, the second sub-pixel, the third sub-pixel, and the fourth sub-pixel, the orthographic projection of at least part of the shielding pattern on the substrate is located between the orthographic projection of the first conductive connection portion on the substrate and the orthographic projection of the fifth conductive connecting portion on the substrate.

Optionally, the first sub-pixel, the second sub-pixel, the third sub-pixel, and the fourth sub-pixel each include: a light emitting element, an initialization signal line pattern, a reset signal line pattern, a gate line pattern, and a light emitting control signal line pattern and a power signal line pattern, at least part of the initialization signal line pattern, at least part of the reset signal line pattern, at least part of the gate line pattern and at least part of the light emitting control signal line pattern extend along the first direction, at least part of the power signal line pattern extends along the second direction; the first sub-pixel, the second sub-pixel, the third sub-pixel, and the fourth sub-pixel further include: a first transistor, a second transistor, a driving transistor, a data writing transistor, a fifth transistor, a sixth transistor, a seventh transistor, and a storage capacitor; in each sub-pixel, a gate electrode of the driving transistor is electrically connected to a second electrode of the first transistor, a first electrode of the driving transistor is electrically connected to a second electrode of the fifth transistor, a second electrode of the driving transistor is electrically connected to a first electrode of the first transistor; a gate electrode of the first transistor is electrically connected to the gate line pattern; a gate electrode of the second transistor is electrically connected to the reset signal line pattern, a first electrode of the second transistor is electrically connected to the initialization signal line pattern, and a second electrode of the second transistor is electrically connected to the gate electrode of the driving transistor; a gate electrode of the data writing transistor is electrically connected to the gate line pattern, a first electrode of the data writing transistor is electrically connected to the data line pattern included in the sub-pixel, and a second electrode of the data writing transistor is electrically connected to the first electrode of the driving transistor; a gate electrode of the fifth transistor is electrically connected to the light emitting control signal line pattern, and a first electrode of the fifth transistor is electrically connected to the power signal line pattern; a gate electrode of the sixth transistor is electrically connected to the light emitting control signal line pattern, a first electrode of the sixth transistor is electrically connected to the second electrode of the driving transistor, and a second electrode of the sixth transistor is electrically connected to the light emitting element; a gate electrode of the seventh transistor is electrically connected to a reset signal line pattern in an adjacent next sub-pixel along the second direction, and a first electrode of the seventh transistor is connected to an initialization signal line pattern in the adjacent next sub-pixel along the second direction, and a second electrode of the seventh transistor is electrically connected to the light emitting element; a first electrode plate of the storage capacitor is multiplexed as the gate electrode of the driving transistor, and a second electrode plate of the storage capacitor is electrically connected to the power signal line pattern.

In a second aspect, the present disclosure provides in some embodiments a display device including the display substrate.

In a third aspect, the present disclosure provides in some embodiments a method for manufacturing a display substrate, including: forming a plurality of sub-pixels arranged in an array on a substrate, wherein the plurality of sub-pixels includes: a first sub-pixel and a second sub-pixel arranged along a second direction, the first sub-pixel includes a first data line pattern, and the second sub-pixel includes a second data line pattern, the first data line pattern is configured to provide a first data signal to the first sub-pixel, and the second data line pattern is configured to provide a second data signal to the second sub-pixel; at least part of the first data line pattern and at least part of the second data line pattern extend along the second direction, and the first data line pattern is located on a first side of a same column of first sub-pixels extending along the second direction, the second data line pattern is located on a second side of a same column of the second sub-pixels extending along the second direction; the first side and the second side is opposite to each other along a first direction, and the first direction intersects the second direction; the first sub-pixel includes a sixth transistor, and a third conductive connecting portion, a fourth conductive connecting portion, and an anode pattern stacked in a direction away from the substrate; a second electrode of the sixth transistor is electrically connected to the anode pattern through the third conductive connection portion and the fourth conductive connection portion; in the first sub-pixel, an orthographic projection of the anode pattern on the substrate at least partially overlaps an orthographic projection of the second data line pattern on the substrate, and the orthographic projection of the anode pattern on the substrate at least partially overlaps an orthographic projection of a data line pattern adjacent to the second data line pattern along the first direction on the substrate.

BRIEF DESCRIPTION OF THE DRAWINGS

The drawings described here are used to provide a further understanding of the present disclosure and constitute a part of the present disclosure. The exemplary embodiments of the present disclosure are used to explain the present disclosure, and do not constitute an improper limitation of the present disclosure.

DETAILED DESCRIPTION

In order to further illustrate a display substrate, a method for manufacturing the same and a display device provided by the embodiments of the present disclosure, a detailed description will be given below with reference to the accompanying drawings.

The structure of the AMOLED display panel includes a substrate, a plurality of sub-pixel driving circuits arranged on the substrate, and a plurality of light emitting elements arranged on a side of the sub-pixel driving circuit away from the substrate. The sub-pixel driving circuits have a one-to-one correspondence with the plurality of light emitting elements, and the sub-pixel driving circuit is used to drive a corresponding light emitting element to emit light, so as to realize the display function of the display panel.

Figure 1A:
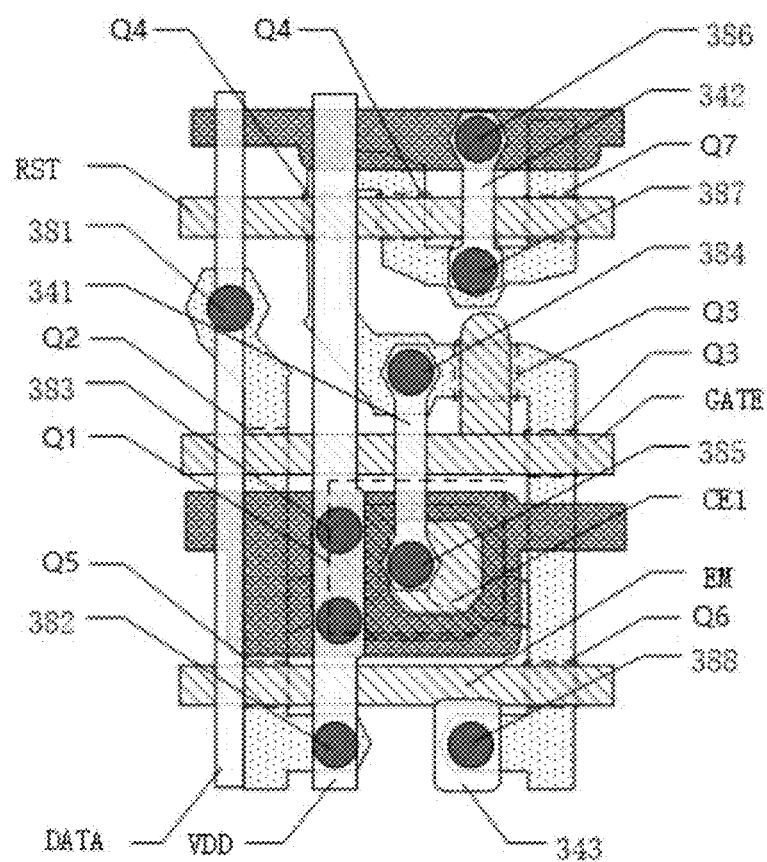
FIG. 1a is a schematic diagram of a layout of sub-pixels in the related art.
Figure 1B:
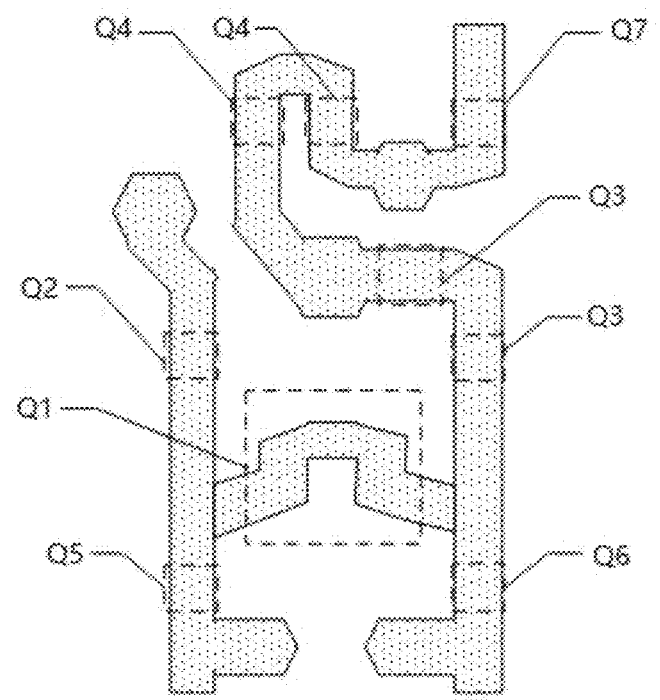
FIG. 1b is a schematic diagram of a layout of an active layer in FIG. 1.
Figure 1C:
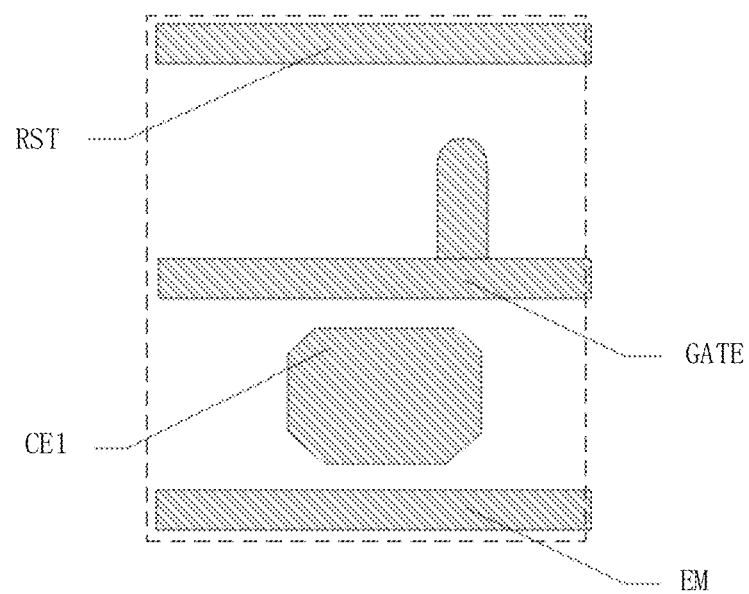
FIG. 1c is a schematic diagram of a layout of a first gate metal layer in FIG. 1.
Figure 1D:
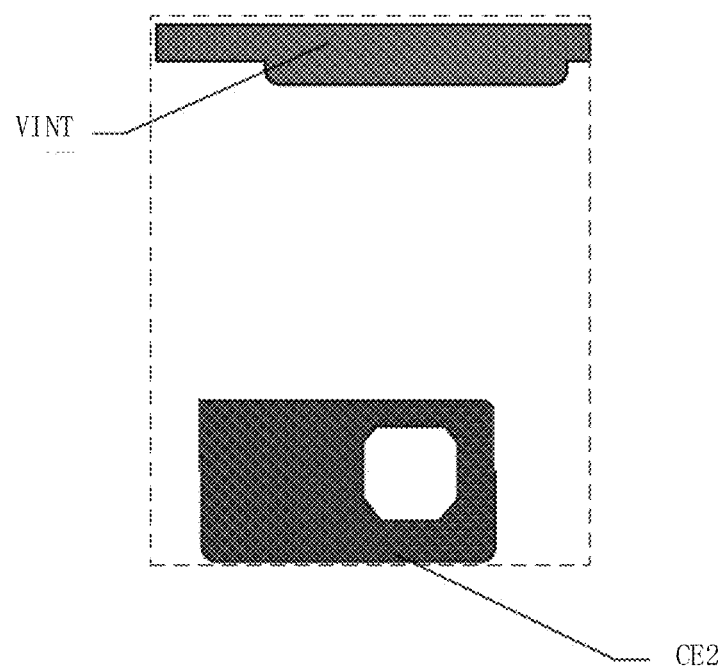
FIG. 1d is a schematic diagram of a layout of a second gate metal layer in FIG. 1.
Figure 1E:
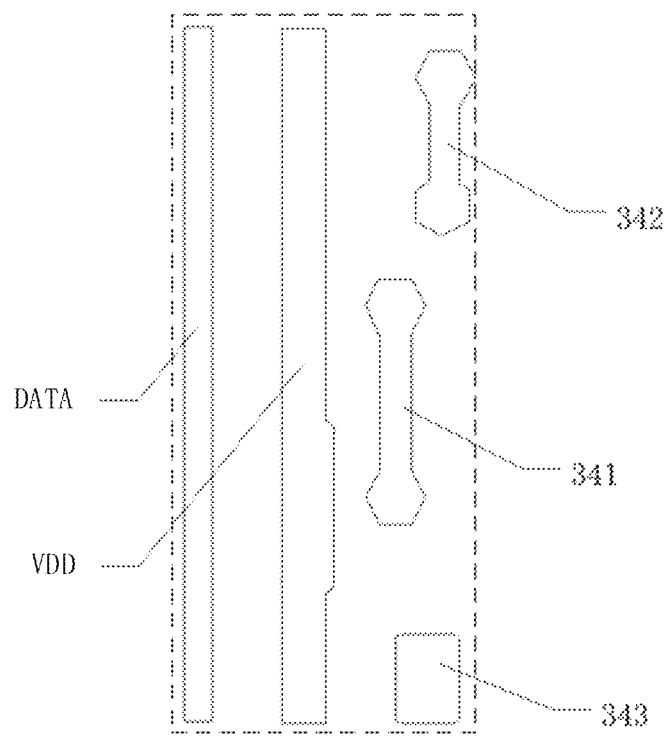
FIG. 1e is a schematic diagram of a layout of a source-drain metal layer in FIG. 1.

In the related art, the sub-pixel driving circuit generally includes a plurality of thin film transistors, as shown in FIG. 1a. When the sub-pixel driving circuit includes 7 thin film transistors Q1 to Q7, the specific layout of the 7 thin film transistors is shown in FIG. 1a. With this layout, the sub-pixel driving circuit includes an active layer as shown in FIG. 1b, a first metal layer as shown in FIG. 1c, and a second metal layer as shown in FIG. 1d, and a third metal layer as shown in FIG. 1e. The active layer includes an active pattern used to form a channel region of each thin film transistor (the part within the dashed box in FIG. 1b), and a doped active pattern electrically connected to the active pattern, the doped active pattern has conductive properties (the part outside the dashed box in FIG. 1b); the first metal layer includes a gate electrode of each thin film transistor, a scan signal line GATE electrically connected to the gate electrode, an electrode plate CE1 of a storage capacitor in the sub-pixel driving circuit, a reset signal line RST, and a light emitting control signal line EM. The second metal layer includes an initialization signal line VINT, another electrode plate CE2 of the storage capacitor in the sub-pixel driving circuit. The third metal layer includes a data line DATA, a power signal line VDD, and some conductive connection portions (marked as 341 to 343).

As shown in FIG. 1, in the layout of the sub-pixel driving circuit, in order to realize the electrical connection between the functional patterns arranged in different layers, some via holes (marked as 381 to 388) can also be set.

With the development of AMOLED technology, the requirements for display effects are getting higher and higher. AMOLED display products have many performance specifications, and color shift is an important parameter.

Figure 1F:
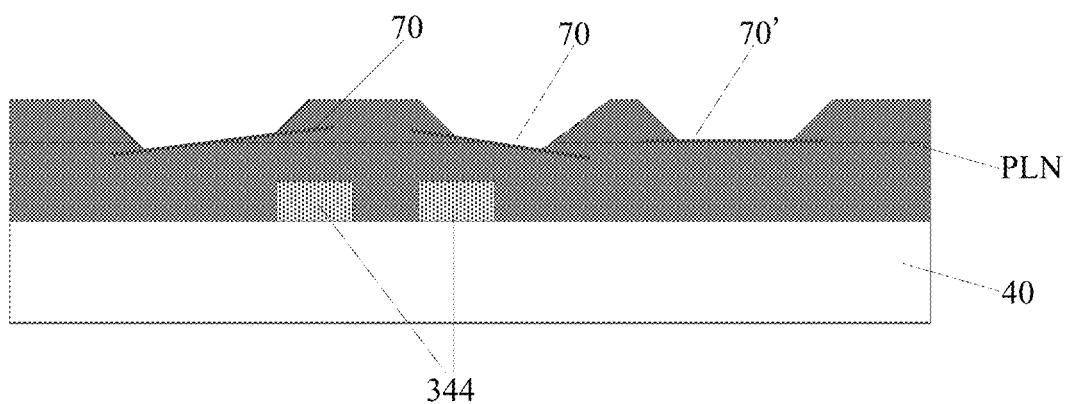
FIG. 1f is a schematic sectional diagram of an anode pattern in the related art.

As shown in FIG. 1f, due to the difference in the structure of the film under the planarization layer PLN, there will be height differences in different positions above the planarization layer PLN, and the thickness of the source-drain metal pattern 344 is relatively large. This problem is particularly serious at the position of the source-drain metal pattern 344. If there is no source-drain metal pattern 344 under the anode pattern 70', the anode pattern 70' will be relatively flat. If one side of the anode pattern 70 has the source-drain metal pattern 344 and the other side of the anode pattern 70 has not the source-drain metal pattern 344, the height difference between the two sides of the anode pattern will be caused, and the anode pattern 70 will be "tilted", so that a single sub-pixel may emit light with different intensity at the left side and the right side. Moreover, due to the different "tilt" directions of the anode patterns of sub-pixels in different colors, the light intensities emitted by the various sub-pixels at the left side and the right side does not match. In this case, a color shift of the large view angle will occur in the display panel. A phenomenon of redness on one side and blueness on the other side will occur.

It can be seen that the design of the source-drain metal pattern 344 under the anode pattern has a great influence on the color shift of the display panel. A position of the anode pattern 70 under which the source-drain metal pattern 344 is provided is lower, while a position of the anode pattern 70 under which the source-drain metal pattern 344 is not provided is higher. The flatness of the anode pattern directly affects the light emission of the pixel and determines the color shift characteristics of the panel.

In the related art, the layout position of the anode pattern causes the problem of "tilting", which leads to the phenomenon of color shift in the display product.

As shown in FIGS. 12-15, embodiments of the present disclosure provide a display substrate, including: a substrate and a plurality of sub-pixels arranged in an array on the substrate, and the plurality of sub-pixels includes: a first sub-pixel M1 and a second sub-pixel M2 arranged along a second direction. The first sub-pixel M1 includes a first data line pattern 981, and the second sub-pixel M2 includes a second data line pattern 982. The first data line pattern 981 is configured to provide a first data signal to the first sub-pixel M1, and the second data line pattern 982 is configured to provide a second data signal to the second sub-pixel M2.

At least part of the first data line pattern 981 and at least part of the second data line pattern 982 extend along the second direction, and the first data line pattern 981 is located on a first side of a same column of first sub-pixels M1 extending along the second direction, the second data line pattern 982 is located on a second side of a same column of the second sub-pixels M2 extending along the second direction; the first side and the second side is opposite along a first direction, and the first direction intersects the second direction.

The first sub-pixel M1 includes a sixth transistor T6, and a third conductive connecting portion 963, a fourth conductive connecting portion 964, and an anode pattern stacked in a direction away from the substrate; a second electrode of the sixth transistor T6 is electrically connected to the anode pattern through the third conductive connection portion 963 and the fourth conductive connection portion 964.

In the first sub-pixel M1, the orthographic projection of the anode pattern on the substrate at least partially overlaps the orthographic projection of the second data line pattern 982 on the substrate, and the orthographic projection of the anode pattern on the substrate at least partially overlaps the orthographic projection of a data line pattern adjacent to the second data line pattern 982 along the first direction on the substrate.

Specifically, the display substrate includes a plurality of sub-pixels arranged on a substrate in an array, and the plurality of sub-pixels can be divided into a plurality of rows of sub-pixels and a plurality of columns of sub-pixels. The plurality of rows of sub-pixels are arranged along the second direction, and each row of sub-pixels include a plurality of the sub-pixels sequentially arranged along the first direction. The plurality of columns of sub-pixels are arranged along the first direction, and each column of sub-pixels include a plurality of sub-pixels sequentially arranged along a second direction.

Exemplarily, the first direction includes a horizontal direction, and the second direction includes a vertical direction.

At least part of the first data line pattern 981 and at least part of the second data line pattern 982 extend along the second direction. The first data line patterns 981 included in the first sub-pixels M1 in the same column of sub-pixels are electrically connected in sequence to form an integral structure. The second data line patterns 982 included in the second sub-pixels M2 in the same column of sub-pixels are electrically connected in sequence to form an integral structure.

Figure 15:
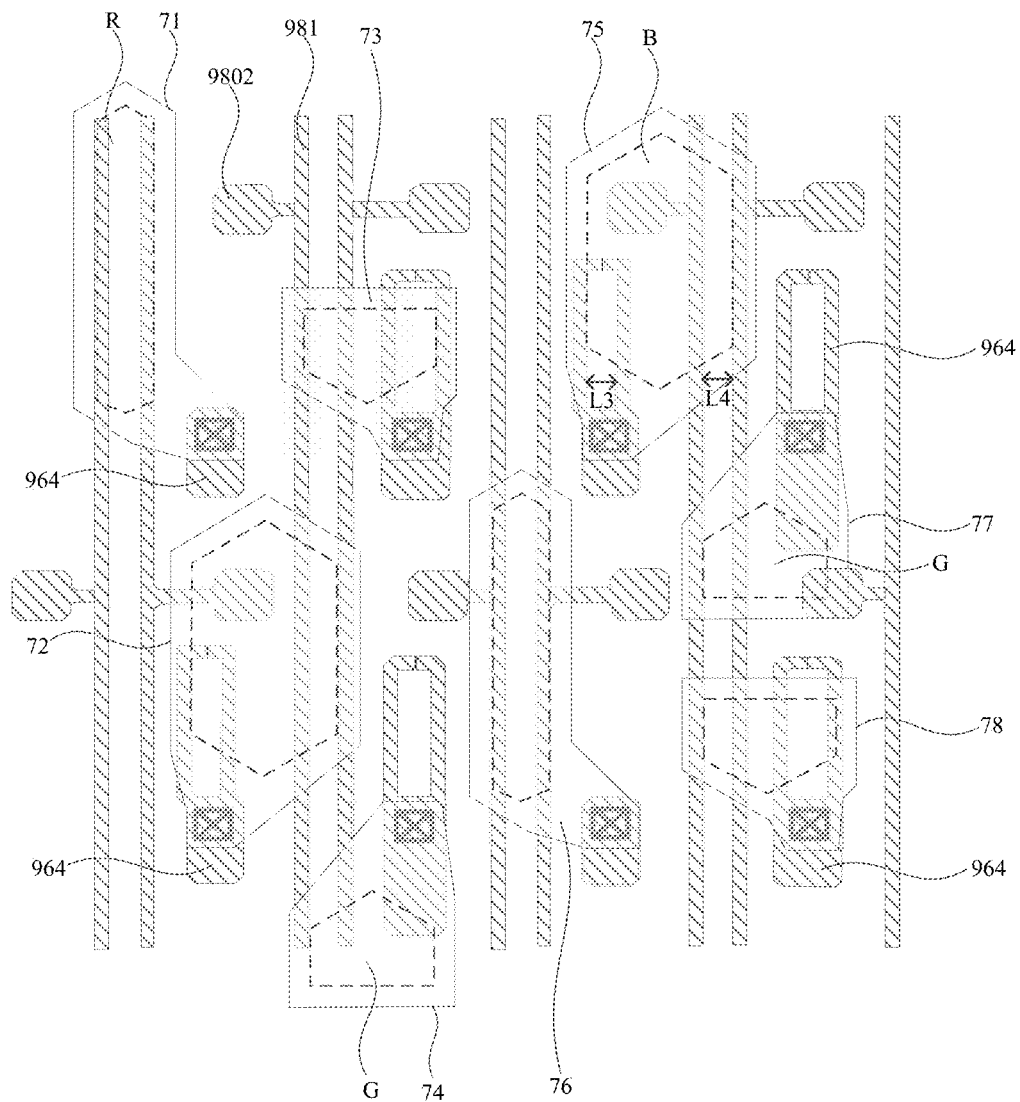
FIG. 15 is a schematic diagram of the layout of a second source-drain metal layer and the anode layer according to an embodiment of the present disclosure.

Exemplarily, as shown in FIG. 15, the first data line pattern 981 is a data line portion between a data writing position of a current first sub-pixel M1 (for example, the position where a data line protrusion 9802 is located) and a data writing position of an adjacent first sub-pixel M1 in the next row along the second direction.

Exemplarily, in the same column of sub-pixels, the first sub-pixel M1 and the second sub-pixel M2 are alternately arranged.

Exemplarily, in the same column of sub-pixels, the first sub-pixel M1 is an odd-numbered sub-pixel, and the odd-numbered sub-pixel receives the first data signal provided by the first data line pattern 981 included therein, and the second sub-pixel M2 is an even-numbered sub-pixel, and the even-numbered sub-pixel receives the second data signal provided by the second data line pattern 982 included therein.

Figure 5:
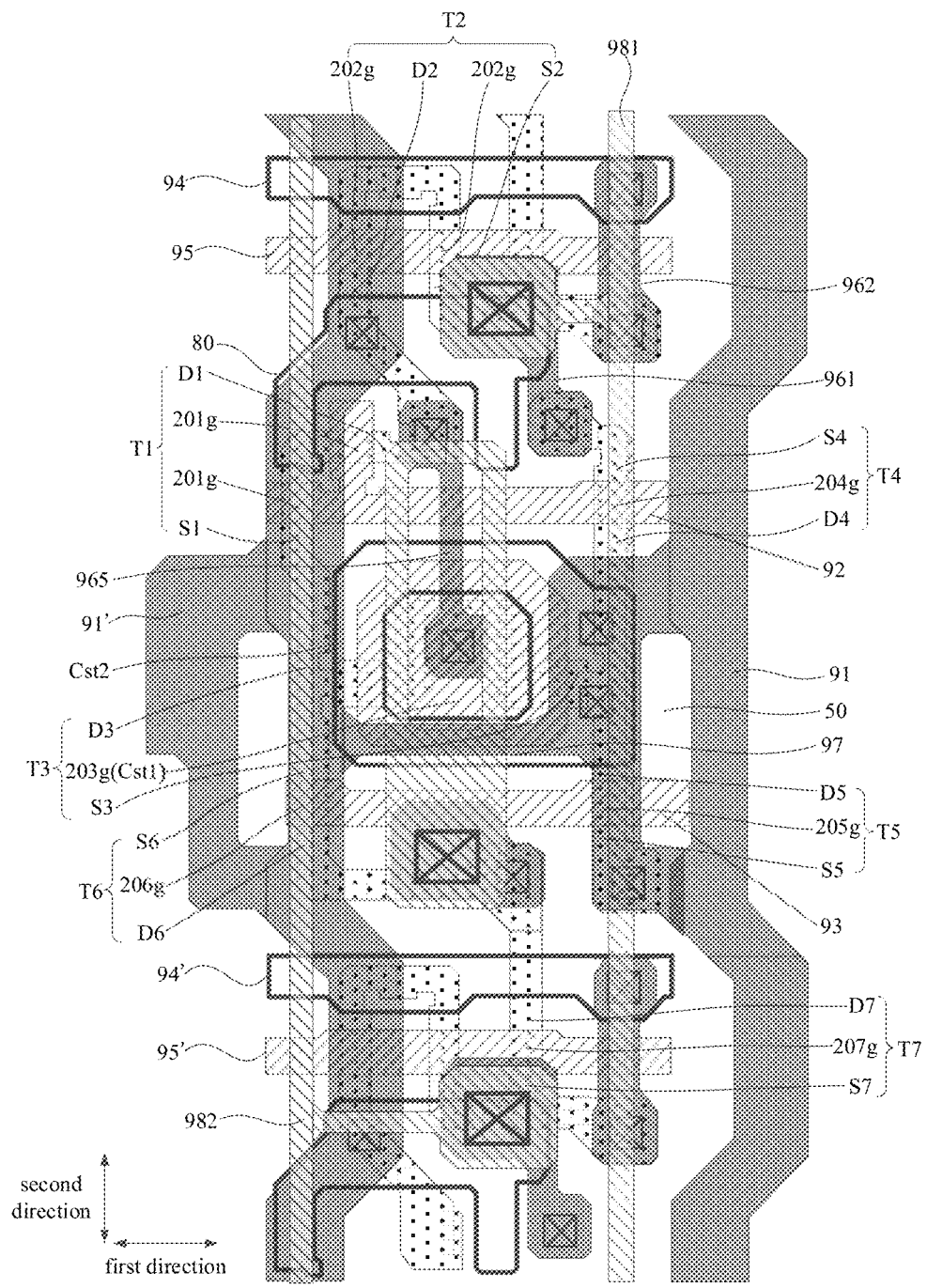
FIG. 5 is a schematic diagram of a second layout of sub-pixels provided by an embodiment of the disclosure.

Exemplarily, the first side is the right side in FIG. 5, and the second side is the left side in FIG. 5. In the same column of sub-pixels, the first data line pattern 981 is located at the first side of the same column of sub-pixels, and the second data line pattern 982 is located at the second side of the same column of sub-pixels.

Figure 2:
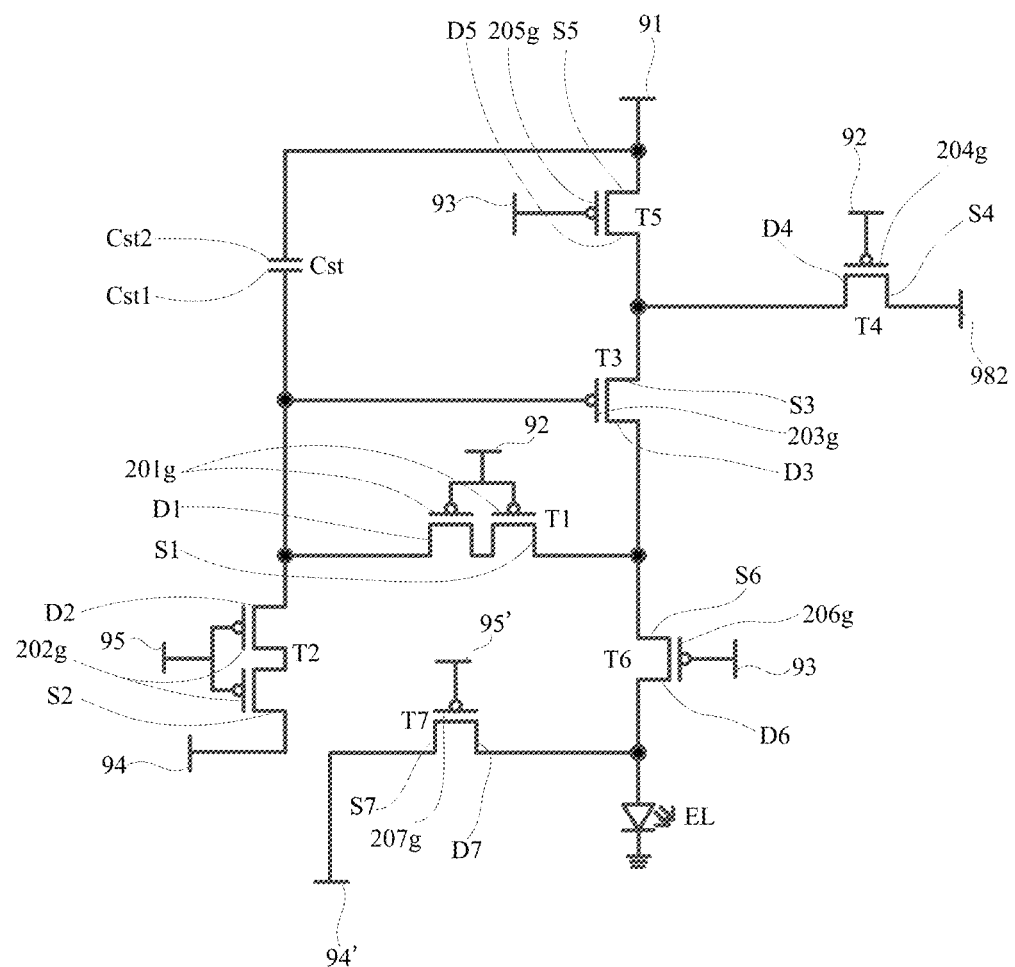
FIG. 2 is a circuit diagram of a sub-pixel driving circuit provided by an embodiment of the disclosure.

Each of the first sub-pixel M1 and the second sub-pixel M2 includes a sub-pixel driving circuit. The sub-pixel driving circuit includes a storage capacitor and a plurality of thin film transistors. As shown in FIG. 2 and FIG. 5, exemplarily, the sub-pixel driving circuit includes 7T1C, that is, seven transistors and one storage capacitor. The sub-pixel driving circuit is used to generate a driving signal for driving the light emitting element to emit light.

Exemplarily, the sub-pixel driving circuit includes a driving transistor and a data writing transistor. In the first sub-pixel M1, a first electrode of the data writing transistor is electrically connected to the first data line pattern 981. In the second sub-pixel M2, a first electrode of the data writing transistor is electrically connected to the second data line pattern 982. In each sub-pixel, a second electrode of the data writing transistor is electrically connected to the first electrode of the driving transistor, and the data writing transistor can transmit the data signal received by the first electrode thereof to the first electrode of the driving transistor.

In the same column of sub-pixels, the data line patterns electrically connected to the first electrodes of the data writing transistors in adjacent sub-pixels are different. In more detail, in the same column of sub-pixels, the first electrode of the data writing transistor included in one of the adjacent sub-pixels is electrically connected to the first data line pattern 981, and the first electrode of the data writing transistor included in the other of the adjacent sub-pixels is electrically connected to the second data line pattern 982.

Each sub-pixel includes a light emitting element on a side of the sub-pixel driving circuit away from the substrate. The light emitting element includes an anode pattern, a light emitting function layer, and a cathode that are sequentially stacked in a direction away from the substrate. The anode pattern is electrically connected to the sub-pixel driving circuit in the sub-pixel to which the anode pattern belongs, and receives the driving signal provided by the sub-pixel driving circuit. The light emitting functional layer includes an organic light emitting material layer. In addition, the light emitting functional layer may also include: an electron transporting layer (ETL), an electron injection layer (EIL), and an hole transporting layer (HTL) and a hole injection layer (HIL) that are common layers of the entire structure. The cathode is electrically connected to a negative power signal line in the display substrate, and receives a negative power signal provided by the negative power signal line. The light emitting function layer emits light under the cooperation of the anode pattern and the cathode to realize the display function of the display substrate.

Figure 12:
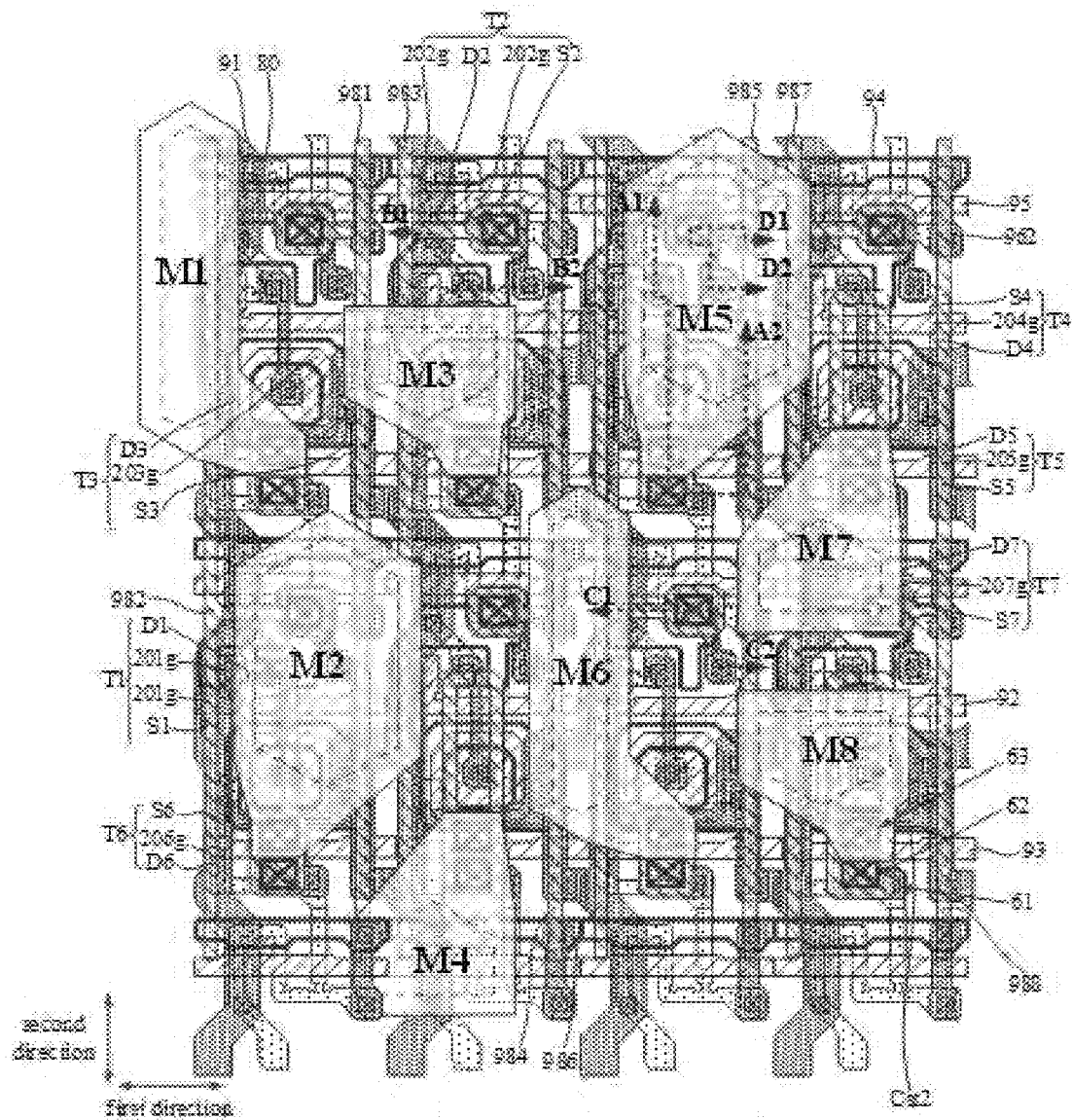
FIG. 12 is a schematic diagram of the layout of eight sub-pixels.
Figure 13A:
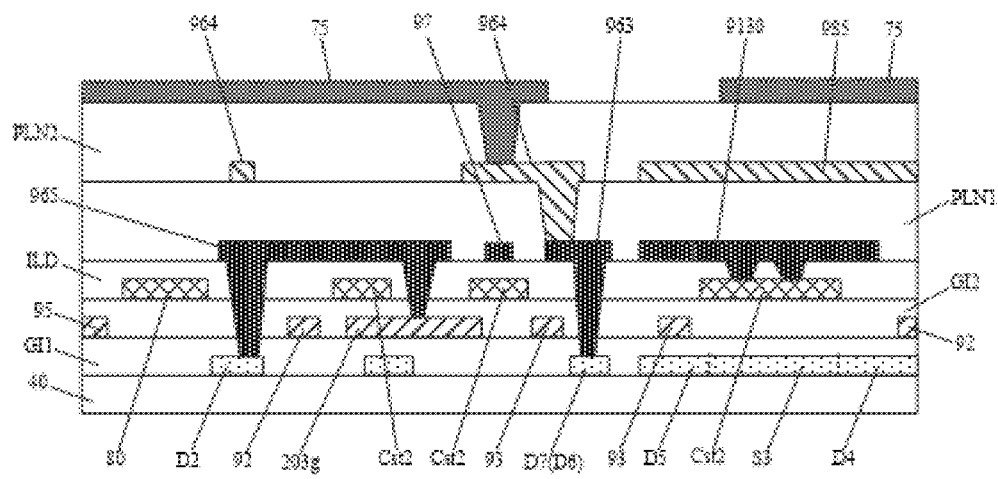
FIG. 13a is a schematic cross-sectional view along the A1-A2 direction in FIG. 12.

As shown in FIGS. 12, 13a and 15, each sub-pixel in the display substrate includes a sixth transistor T6. The gate electrode of the sixth transistor T6 is electrically connected to the light emitting control signal line pattern 93. The first electrode of the sixth transistor T6 is electrically connected to the second electrode of the driving transistor, the orthographic projection of the second electrode of the sixth transistor T6 on the substrate and the orthographic projection of the third conductive connection portion 963 on the substrate have a third overlapping area, and the second electrode of the sixth transistor T6 is electrically connected to the third conductive connection portion 963 through a first via hole 61 provided in the third overlapping area. The orthographic projection of the third conductive connecting portion 963 on the substrate and the orthographic projection of the fourth conductive connecting portion 964 on the substrate have a fourth overlapping area, and the third conductive connecting portion 963 and the fourth conductive connecting portion 964 is electrically connected through a second via hole 62 provided in the fourth overlapping area; the orthographic projection of the fourth conductive connecting portion 964 on the substrate and the orthographic projection of the anode pattern (such as the first anode pattern 71 to the eighth anode pattern 78) on the substrate have a fifth overlapping area, and the fourth conductive connecting portion 964 and the anode pattern are electrically connected through a third via hole 63 provided in the fifth overlapping area.

During the light emitting phase, the sixth transistor T6 transmits the driving signal outputted by the second electrode of the driving transistor to the anode of the light emitting element through the third conductive connection portion 963 and the fourth conductive connection portion 964 in sequence.

The second electrode of the sixth transistor T6 is electrically connected to the anode pattern through the third conductive connection portion 963 and the fourth conductive connection portion 964 in sequence, which ensures the electrical connection between the second electrode of the sixth transistor T6 and the anode pattern.

Exemplarily, as shown in FIGS. 11, 12, 13a, 14 and 15, in the first sub-pixel M1, the fourth conductive connection portion 964 includes a solid portion; the orthographic projection of the solid portion on the substrate at least partially overlaps the orthographic projection of the anode pattern on the substrate; the orthographic projection of the anode pattern on the substrate does not overlap the orthographic projection of the first data line pattern 981 on the substrate, and the orthographic projection of the anode pattern on the substrate at least partially overlaps the orthographic projection of the second data line pattern 982 on the substrate.

Exemplarily, in the first sub-pixel M1, the light emitting element includes a first light emitting element, and the first light emitting element includes a first anode pattern 71, a first light emitting functional layer and a cathode stacked arranged along a direction away from the substrate. Exemplarily, the first light emitting element includes a red light emitting element.

Exemplarily, in the first sub-pixel M1, the orthographic projection of the solid portion on the substrate and the orthographic projection of the third conductive connection portion 963 on the substrate have the fourth overlapping area; the orthographic projection of the solid portion on the substrate and the orthographic projection of the first anode pattern 71 on the substrate have the fifth overlapping area.

Exemplarily, the orthographic projection of the first anode pattern 71 on the substrate does not overlap the orthographic projection of the first data line pattern 981 on the substrate. The orthographic projection of the first anode pattern 71 on the substrate does not overlap the orthographic projection of an adjacent third data line pattern 983 along the first direction on the substrate, and the orthographic projection of the first anode pattern 71 on the substrate at least partially overlaps the orthographic projection of an adjacent second data line pattern 982 along the second direction on the substrate.

Exemplarily, the orthographic projection of a first side portion of the first anode pattern 71 on the substrate overlaps the orthographic projection of the adjacent second data line pattern 982 along the second direction on the substrate; the orthographic projection of a second side portion of the first anode pattern 71 on the substrate overlaps the orthographic projection of an eighth data line pattern 988 adjacent to the second data line pattern 982 in the first direction on the substrate; the first side portion and the second side portion are oppositely arranged along the first direction.

According to the specific structure of the above-mentioned display substrate, in the display substrate provided by the embodiment of the present disclosure, in the first sub-pixel M1, the orthographic projection of the anode pattern on the substrate is set to at least partially overlap the orthographic projection of the second line pattern on the substrate, the orthographic projection of the anode pattern on the substrate at least partially overlaps the orthographic projection of a data line pattern adjacent to the second data line pattern along the first direction on the substrate; so that the second data line pattern 982 and the adjacent data line pattern can compensate for the step difference generated under the anode pattern (such as the first anode pattern 71) with each other, The anode pattern can be formed on a relatively flat surface, so that the anode pattern has a high flatness, thereby ensuring that the light intensities emitted by the sub-pixel in all directions are consistent, and effectively improving the color shift of the display product when the display substrate is applied to the display product.

As shown in FIGS. 11, 12, 13a, 14 and 15, in some embodiments, in the first sub-pixel M1, the anode pattern and the first data line pattern 981 do not overlap.

Specifically, in the first sub-pixel M1, the first anode pattern 71 and the first data line pattern 981 do not overlap.

As shown in FIGS. 11, 12, 13a, 14 and 15, in some embodiments, the second sub-pixel M2 includes a sixth transistor T6, and a third conductive connection portion 963, a fourth conductive connection portion 964 and the anode pattern stacked in a direction away from the substrate. The second electrode of the sixth transistor T6 is electrically connected to the anode pattern through the third conductive connection portion 963 and the fourth conductive connection portion 964.

In the second sub-pixel M2, the fourth conductive connection portion 964 includes a solid portion 9641 and a hollow portion 9642.

The orthographic projection of the anode pattern on the substrate at least partially overlaps the orthographic projection of the first data line pattern 981 on the substrate, and at least partially overlaps the orthographic projection of a data line pattern adjacent to the first data line pattern 981 along the first direction on the substrate.

The orthographic projection of the anode pattern on the substrate at least partially overlaps the orthographic projection of the second data line pattern 982 on the substrate, and at least partially overlaps the orthographic projection of the solid portion 9641 on the substrate and the orthographic projection of the hollow portion 9642 on the substrate.

Specifically, in the second sub-pixel M2, the light emitting element includes a second light emitting element, and the second light emitting element includes a second anode pattern 72, a second light emitting functional layer and a cathode that are sequentially stacked in a direction away from the substrate. Exemplarily, the second light emitting element includes a blue light emitting element.

Exemplarily, in the second sub-pixel M2, the orthographic projection of the solid portion 9641 on the substrate and the orthographic projection of the third conductive connecting portion 963 on the substrate have the fourth overlapping area; the orthographic projection of the solid portion 9641 on the substrate and the orthographic projection of the second anode pattern 72 on the substrate have the fifth overlapping area.

Exemplarily, the orthographic projection of the second side portion of the second anode pattern 72 on the substrate at least partially overlaps the orthographic projection of the second data line pattern 982 in a sub-pixel to which the second anode pattern 72 belongs on the substrate, the orthographic projection of the second side portion of the second anode pattern 72 on the substrate overlaps the orthographic projection of the solid portion on the substrate, and the orthographic projection of the hollow portion on the substrate; the orthographic projection of the first side portion of the second anode pattern 72 on the substrate overlaps the orthographic projection of the adjacent first data line pattern 981 along the second direction on the substrate, and overlaps the orthographic projection of the third data line pattern 983 adjacent to the first data line pattern 981 along the second direction on the substrate. The first side portion and the second side portion are arranged opposite to each other along the first direction.

Exemplarily, the hollow portion 9642 is formed in a mouth shape, and the orthographic projection of the second side portion of the second anode pattern 72 on the substrate overlap the orthographic projections of two sides of the hollow portion opposite to each other along the first direction on the substrate. Exemplarily, the orthographic projection of the second side portion of the second anode pattern 72 on the substrate overlap the orthographic projections of two sides of the hollow portion opposite to each other along the second direction on the substrate.

In the display substrate provided by the foregoing embodiment, the fourth conductive connection portion 964 and the second data line pattern 982 can compensate for the step difference generated by the first data line pattern 981 and a data line pattern (such as the third data line pattern 983) adjacent to the first data line pattern 981 under the second anode pattern 72, so that the second anode pattern 72 can be formed on a relatively flat surface, the second anode pattern 72 has a high flatness, thereby effectively reducing the color shift generated by the display substrate during display.

As shown in FIGS. 11, 12, 13*a*, 14 and 15, in some embodiments, the third sub-pixel M3 and the fourth sub-pixel M4 are arranged along the second direction, along the first direction, the third sub-pixel M3 and the first sub-pixel M1 are located in the same row, and the fourth sub-pixel M4 and the second sub-pixel M2 are located in the same row.

The third sub-pixel M3 includes a third data line pattern 983, the fourth sub-pixel M4 includes a fourth data line pattern 984, at least part of the third data line pattern 983 and at least part of the fourth data line pattern 984 extends along the second direction, the third data line pattern 983 is located on the second side of the same columns of third sub-pixels M3 extending along the second direction, and the fourth data line pattern 984 is located on the first side of the same column of fourth sub-pixels M4 extending in the second direction.

The third sub-pixel M3 includes a sixth transistor T6, and a third conductive connecting portion 963, a fourth conductive connecting portion 964, and an anode pattern stacked in a direction away from the substrate; the second electrode of the sixth transistor T6 is electrically connected to the anode pattern through the third conductive connection portion 963 and the fourth conductive connection portion 964.

In the third sub-pixel M3, the fourth conductive connection portion 964 includes a solid portion 9641 and a hollow portion 9642.

The orthographic projection of the anode pattern on the substrate at least partially overlaps the orthographic projection of the solid portion 9641 on the substrate and the orthographic projection of the hollow portion 9642 on the substrate, respectively;

The orthographic projection of the anode pattern on the substrate at least partially overlaps the orthographic projection of the third data line pattern 983 on the substrate, and at least partially overlaps the orthographic projection of a data line pattern adjacent to the third data line pattern 983 along the first direction on the substrate.

Specifically, at least part of the third data line pattern 983 and at least part of the fourth data line pattern 984 both extend along the second direction. The third data line patterns 983 included in third sub-pixels M3 in the same column of sub-pixels are electrically connected in sequence to form an integral structure. The fourth data line patterns 984 included in fourth sub-pixels M4 in the same column of sub-pixels are electrically connected in sequence to form an integral structure. The third data line pattern 983 is configured to provide a third data signal to the third sub-pixel M3, and the fourth data line pattern 984 is configured to provide a fourth data signal to the fourth sub-pixel M4.

Exemplarily, along the first direction, the third sub-pixel M3 and the first sub-pixel M1 are located in the same row, and the fourth sub-pixel M4 and the second sub-pixel M2 are located in the same row.

Exemplarily, in the same column of sub-pixels, the third sub-pixel M3 and the fourth sub-pixel M4 are alternately arranged.

Similarly, the third sub-pixel M3 and the fourth sub-pixel M4 each include a sub-pixel driving circuit. In the third sub-pixel M3, the first electrode of the data writing transistor is electrically connected to the third data line patterns 983. In the fourth sub-pixel M4, the first electrode of the data writing transistor is electrically connected to the fourth data line pattern 984. In each sub-pixel, the second electrode of the data writing transistor is electrically connected to the first electrode of the driving transistor, and the data writing transistor can transmit the data signal received by the first electrode of the data writing transistor to the first electrode of the driving transistor.

Exemplarily, the first side is set as the right side in FIG. 5, and the second side is set as the left side in FIG. 5. The third data line pattern 983 is located on the second side of the same column of third sub-pixels extending along the second direction, and the fourth data line pattern 984 is located on the first side of the same column of fourth sub-pixels extending along the second direction.

Exemplarily, among the sub-pixels located in the same row along the first direction, the first data line pattern 981 and the third data line pattern 983 are both located between the first sub-pixel M1 to which the first data line pattern 981 belongs and the third sub-pixels M3 to which the third data line pattern 983 belongs. Among the sub-pixels located in the same row along the first direction, the second data line pattern 982 and the fourth data line pattern 984 are both located between the second sub-pixel M2 to which the second data line pattern 982 belongs and the fourth sub-pixels M4 to which the fourth data line pattern 984 belongs.

The third sub-pixel M3 and the fourth sub-pixel M4 each include: a power signal line pattern and a power compensation pattern, and the structure of the power signal line pattern is the same as structures of power signal line patterns in the first sub-pixel M1 and the second sub-pixel M2, and the structure of the power compensation pattern is the same as structures of the power compensation patterns in the first sub-pixel M1 and the second sub-pixel M2.

It is worth noting that the first sub-pixel M1, the second sub-pixel M2, the third sub-pixel M3, and the fourth sub-pixel M4 include sub-pixel driving circuits that have the same structure, and the difference among the first sub-pixel M1, the second sub-pixel M2, the third sub-pixel M3, and the fourth sub-pixel M4 lies in the arrangement of data lines and the structure of the light emitting element.

In the third sub-pixel M3, the light emitting element includes a third light emitting element, and the third light emitting element includes a third anode pattern 73, a third light emitting functional layer, and a cathode stacked in sequence along a direction away from the substrate. Exemplarily, the third light emitting element includes a green light emitting element.

Exemplarily, in part of the third sub-pixels M3, the orthographic projection of the solid portion 9641 on the substrate and the orthographic projection of the third conductive connecting portion 963 on the substrate have the fourth overlapping area; the orthographic projection of the solid portion 9641 on the substrate and the orthographic projection of the third anode pattern 73 on the substrate have the fifth overlapping area.

Exemplarily, the orthographic projection of the second side portion of the third anode pattern 73 on the substrate at least partially overlaps the orthographic projection of the third data line pattern 983 in the sub-pixel to which the third anode pattern 73 belongs on the substrate, the orthographic projection of the second side portion of the third anode pattern 73 on the substrate at least partially overlaps the orthographic projection of the adjacent first data line 981 along the first direction on the substrate; the orthographic projection of the first side portion of the third anode pattern 73 on the substrate overlaps the orthographic projection of the solid portion on the substrate and the orthographic projection of the hollow portion on the substrate; the first side portion and the second side portion are oppositely arranged along the first direction.

Exemplarily, the hollow portion 9642 is formed in a mouth shape, and the orthographic projection of the first side portion of the third anode pattern 73 on the substrate overlaps the orthographic projections of the two sides of the hollow portion 9642 opposite to each other along the first direction on the substrate.

The above arrangement enables the fourth conductive connecting portion 964 to compensate for the step difference between the first data line pattern 981 and the third data line pattern 983 under the third anode pattern 73, so that the third anode pattern 73 can be formed on a relatively flat surface, so that the fifth anode pattern 75 has a higher flatness, which effectively reduces the color shift caused by the display substrate during display.

As shown in FIGS. 11, 12, 13a, 14 and 15, in some embodiments, the fourth sub-pixel M4 includes a sixth transistor T6, and a third conductive connection portion 963, a fourth conductive connection portion 964 and the anode pattern stacked in a direction away from the substrate; the second electrode of the sixth transistor T6 is electrically connected to the anode pattern through the third conductive connection portion 963 and the fourth conductive connection portion 964.

In the fourth sub-pixel M4, the fourth conductive connection portion 964 includes a solid portion 9641 and a hollow portion 9642.

The orthographic projection of the anode pattern on the substrate at least partially overlaps the orthographic projection of the solid portion 9641 on the substrate.

The orthographic projection of the anode pattern on the substrate at least partially overlaps with the orthographic projection of the third data line pattern 983 on the substrate, and at least partially overlaps the orthographic projection of a data line pattern adjacent to the third data line pattern 983 along the first direction on the substrate.

Specifically, in the fourth sub-pixel M4, the light emitting element includes a fourth light emitting element, and the fourth light emitting element includes a fourth anode pattern 74 and a fourth light emitting functional layer and a cathode that are sequentially stacked in a direction away from the substrate. Exemplarily, the fourth light emitting element includes a green light emitting element.

Exemplarily, in the fourth sub-pixel M4, the orthographic projection of the solid portion 9641 on the substrate and the orthographic projection of the third conductive connecting portion 963 on the substrate have the fourth overlapping area; the orthographic projection of the solid portion 9641 on the substrate and the orthographic projection of the fourth anode pattern 74 on the substrate have the fifth overlapping area.

Exemplarily, the orthographic projection of the second side portion of the fourth anode pattern 74 on the substrate at least partially intersects the orthographic projection of an adjacent third data line pattern 983 along the second direction on the substrate. The orthographic projection of the second side portion of the fourth anode pattern 74 on the substrate at least partially overlaps the orthographic projection of a first data line pattern 981 adjacent to the third data line pattern 983 along the first direction on the substrate; the orthographic projection of the first side portion of the fourth anode pattern 74 on the substrate overlaps the orthographic projection of the solid portion on the substrate, and does not overlaps the orthographic projection of the hollow portion on the substrate; the first side portion and the second side portion are arranged opposite to each other along the first direction.

The above arrangement enables the fourth conductive connection portion 964 to compensate for the step difference between the first data line pattern 981 and the third data line pattern 983 under the fourth anode pattern 74, so that the fourth anode pattern 74 can be formed on a relatively flat surface, so that the fourth anode pattern 74 has a higher flatness, which effectively reduces the color shift caused by the display substrate during display.

As shown in FIGS. 11, 12, 13a, 14 and 15, in some embodiments, in the fourth sub-pixel M4, the orthographic projection of the anode pattern on the substrate overlaps the orthographic projection of the fourth data line pattern 984 on the substrate.

The orthographic projection of the anode pattern on the substrate does not overlap the orthographic projection of the fourth data line pattern 984 on the substrate, and the orthographic projection of the anode pattern on the substrate does not overlap the orthographic projection of an adjacent second data line patterns 982 along the first direction on the substrate.

It should be noted that, as shown in FIG. 12, the plurality of sub-pixels further include: a fifth sub-pixel M5, a sixth sub-pixel M6, a seventh sub-pixel M7, and an eighth sub-pixel M8; the fifth sub-pixel M5 and the sixth sub-pixel M6 are alternately arranged along the second direction, the seventh sub-pixel M7 and the eighth sub-pixel M8 are alternately arranged along the second direction; along the first direction, the first sub-pixel M1, the third sub-pixel M3, the fifth sub-pixel M5, and the seventh sub-pixel M7 are located in the same row; along the first direction, the second sub-pixel M2, the fourth sub-pixel M4, the sixth sub-pixel M6, and the eighth sub-pixel M8 are located in the same row.

The fifth sub-pixel M5 includes a fifth data line pattern 985, the sixth sub-pixel M6 includes a sixth data line pattern 986, the seventh sub-pixel M7 includes a seventh data line pattern 987, and the eighth sub-pixel M8 includes an eighth data line pattern 988.

As shown in FIG. 12, the eight sub-pixels from the first sub-pixel M1 to the eighth sub-pixel M8 form a repeating unit, and the display substrate includes a plurality of the repeating units.

As shown in FIGS. 11, 12, 13a, 14 and 15, in some embodiments, in the fifth sub-pixel M5, the fourth conductive connection portion 964 includes a solid portion 9641 and a hollow portion 9642. The orthographic projection of the solid portion 9641 on the substrate and the orthographic projection of the hollow portion 9642 on the substrate both at least partially overlap the orthographic projection of the anode pattern on the substrate. The orthographic projection of the anode pattern on the substrate at least partially overlaps the orthographic projection of the fifth data line pattern 985 on the substrate, and the orthographic projection of the anode pattern on the substrate at least partially overlaps the orthographic projection of an adjacent seventh data line patterns 987 along the first direction on the substrate.

Specifically, in the fifth sub-pixel M5, the light emitting element includes a fifth light emitting element, and the fifth light emitting element includes a fifth anode pattern 75, a fifth light emitting functional layer and cathode that are sequentially stacked in a direction away from the substrate. Exemplarily, the fifth light emitting element includes a blue light emitting element.

Exemplarily, in the fifth sub-pixel M5, the orthographic projection of the solid portion 9641 on the substrate and the orthographic projection of the third conductive connecting portion 963 on the substrate have the fourth overlapping area; the orthographic projection of the solid portion 9641 on the substrate and the orthographic projection of the fifth anode pattern 75 on the substrate have the fifth overlapping area.

Exemplarily, the orthographic projection of the first side portion of the fifth anode pattern 75 on the substrate overlaps the orthographic projection of the fifth data line pattern 985 in the sub-pixel to which the fifth anode pattern 75 belongs on the substrate, and overlaps the orthographic projection of a seventh data line pattern 987 adjacent to the fifth data line pattern 985 along the first direction on the substrate. The orthographic projection of the second side portion of the fifth anode pattern 75 on the substrate overlaps the orthographic projection of the hollow portion 9642 on the substrate; the first side portion and the second side portion are arranged opposite to each other along the first direction.

Exemplarily, the hollow portion 9642 is formed in a mouth shape, and the orthographic projection of the second side portion of the fifth anode pattern 75 on the substrate overlaps the orthographic projections of two sides of the hollow portion 9642 opposite to each other along the first direction on the substrate. Exemplarily, the orthographic projection of the second side portion of the fifth anode pattern 75 on the substrate overlaps the orthographic projections of two sides of the hollow portion 9642 opposite to each other along the second direction on the substrate.

Exemplarily, there is a first distance L3 between the two sides of the hollow portion 9642 opposite to each other along the first direction, and in two adjacent sub-pixels along the first direction, there is a second distance L4 along the first direction between the fifth data line pattern 985 and the seventh data line pattern 987 close to each other, and the first distance L3 is equal to the second distance L4.

The above arrangement enables the fourth conductive connecting portion 964 to compensate for the step difference between the fifth data line pattern 985 and the seventh data line pattern 987 under the fifth anode pattern 75, so that the fifth anode pattern 75 can be formed on a relatively flat surface, so that the fifth anode pattern 75 has a higher flatness, which effectively reduces the color shift caused by the display substrate during display.

As shown in FIGS. 11, 12, 13a, 14 and 15, in some embodiments, in the sixth sub-pixel M6, the fourth conductive connection portion 964 includes a solid portion. The orthographic projection of the solid portion on the substrate at least partially overlaps the orthographic projection of the anode pattern on the substrate.

The orthographic projection of the anode pattern on the substrate at least partially overlaps the orthographic projection of the sixth data line pattern 986 on the substrate, and the orthographic projection of the anode pattern on the substrate at least partially overlaps the orthographic projection of an adjacent fourth data line pattern 984 along the first direction on the substrate.

Specifically, in the sixth sub-pixel M6, the light emitting element includes a sixth light emitting element, and the sixth light emitting element includes a sixth anode pattern 76, a sixth light emitting functional layer and a cathode that are sequentially stacked in a direction away from the substrate. Exemplarily, the sixth light emitting element includes a red light emitting element.

Exemplarily, in the sixth sub-pixel M6, the orthographic projection of the solid portion on the substrate and the orthographic projection of the third conductive connection portion 963 on the substrate have the fourth overlapping area; the orthographic projection of the solid portion on the substrate and the orthographic projection of the sixth anode pattern 76 on the substrate have the fifth overlapping area.

Exemplarily, the orthographic projection of the first side portion of the sixth anode pattern 76 on the substrate at least partially overlaps the orthographic projection of the sixth data line pattern 986 on the substrate, and the orthographic projection of the second side portion of the sixth anode pattern 76 on the substrate at least partially overlaps the orthographic projection of an adjacent fourth data line pattern 984 along the first direction on the substrate. The first side portion and the second side portion are arranged opposite to each other along the first direction.

The above arrangement enables the sixth data line pattern 986 and the fourth data line pattern 984 to compensate for the level difference generated below the sixth anode pattern 76, so that the sixth anode pattern 76 can be formed on a flat surface, the sixth anode pattern 76 has a relatively high flatness, which effectively reduces the color shift caused by the display substrate during display.

As shown in FIGS. 11, 12, 13a, 14 and 15, in some embodiments, in the seventh sub-pixel M7, the fourth conductive connection portion includes a solid portion and a hollow portion.

The orthographic projection of the solid portion on the substrate at least partially overlaps the orthographic projection of the anode pattern on the substrate, and the orthographic projection of the hollow portion on the substrate does not overlap the orthographic projection of the anode pattern on the substrate.

The orthographic projection of the anode pattern on the substrate at least partially overlaps the orthographic projection of the seventh data line pattern 987 on the substrate, and the orthographic projection of the anode pattern on the substrate at least partially overlaps the orthographic projection of an adjacent fifth data line pattern 985 along the first direction on the substrate.

Specifically, in the seventh sub-pixel M7, the light emitting element includes a seventh light emitting element, and the seventh light emitting element includes a seventh anode pattern 77, a seventh light emitting functional layer and a cathode that are sequentially stacked in a direction away from the substrate. Exemplarily, the seventh light emitting element includes a green light emitting element.

Exemplarily, in the seventh sub-pixel M7, the orthographic projection of the solid portion 9641 on the substrate and the orthographic projection of the third conductive connection portion 963 on the substrate have the fourth overlapping area; the orthographic projection of the solid portion 9641 on the substrate and the orthographic projection of the seventh anode pattern 77 on the substrate have the fifth overlapping area.

Exemplarily, the orthographic projection of the second side portion of the seventh anode pattern 77 on the substrate at least partially overlaps the orthographic projection of the seventh data line pattern 987 in the sub-pixel to which the seventh anode pattern 77 belongs on the substrate, the orthographic projection of the second side portion of the seventh anode pattern 77 on the substrate at least partially overlaps the orthographic projection of an adjacent fifth data line pattern 985 along the first direction on the substrate; the orthographic projection of the first side portion of the seventh anode pattern 77 on the substrate overlaps the orthographic projection of the solid portion on the substrate; the first side portion and the second side portion are arranged opposite to each other along the first direction.

The above arrangement enables the fourth conductive connection portion 964 to compensate for the level difference generated by the seventh data line pattern 987 and the fifth data line pattern 985 under the seventh anode pattern 77, so that the seventh anode pattern 77 can be formed on a relatively flat surface, so that the seventh anode pattern 77 has a higher flatness, which effectively reduces the color shift caused by the display substrate during display.

As shown in FIGS. 11, 12, 13*a*, 14 and 15, in some embodiments, in the eighth sub-pixel M8, the fourth conductive connection portion 964 includes a solid portion 9641 and a hollow portion 9642.

The orthographic projection of the solid portion 9641 on the substrate and the orthographic projection of the hollow portion 9642 on the substrate both at least partially overlap the orthographic projection of the anode pattern on the substrate.

The orthographic projection of the anode pattern on the substrate does not overlap the orthographic projection of the eighth data line pattern 988 on the substrate, and does not overlap the orthographic projection of an adjacent sixth data line pattern 986 along the first direction on the substrate.

Specifically, in the eighth sub-pixel M8, the light emitting element includes an eighth light emitting element, and the eighth light emitting element includes an eighth anode pattern 78, an eighth light emitting functional layer and a cathode that are sequentially stacked in a direction away from the substrate. Exemplarily, the eighth light emitting element includes a green light emitting element.

Exemplarily, in part of the eighth sub-pixels M8, the orthographic projection of the solid portion 9641 on the substrate and the orthographic projection of the third conductive connecting portion 963 on the substrate have the fourth overlapping area; the orthographic projection of the solid portion 9641 on the substrate and the orthographic projection of the eighth anode pattern 78 on the substrate have the fifth overlapping area.

Exemplarily, the orthographic projection of the second side portion of the eighth anode pattern 78 on the substrate at least partially intersects the orthographic projection of an adjacent seventh data line pattern 987 along the second direction on the substrate. The orthographic projection of the second side portion of the eighth anode pattern 78 on the substrate at least partially overlaps the orthographic projection of a fifth data line pattern 985 adjacent to the seventh data line pattern 987 along the first direction on the substrate; the orthographic projection of the first side portion of the eighth anode pattern 78 on the substrate overlaps the orthographic projection of the solid portion on the substrate, and also overlaps the orthographic projection of the hollow portion on the substrate; the first side portion and the second side portion are oppositely arranged along the first direction.

The above arrangement enables the fourth conductive connection portion 964 to compensate for the step difference between the seventh data line pattern 987 and the fifth data line pattern 985 under the eighth anode pattern 78, so that the eighth anode pattern 78 can be formed on a relatively flat surface, so that the eighth anode pattern 78 has a higher flatness, which effectively reduces the color shift caused by the display substrate during display.

Figure 16:
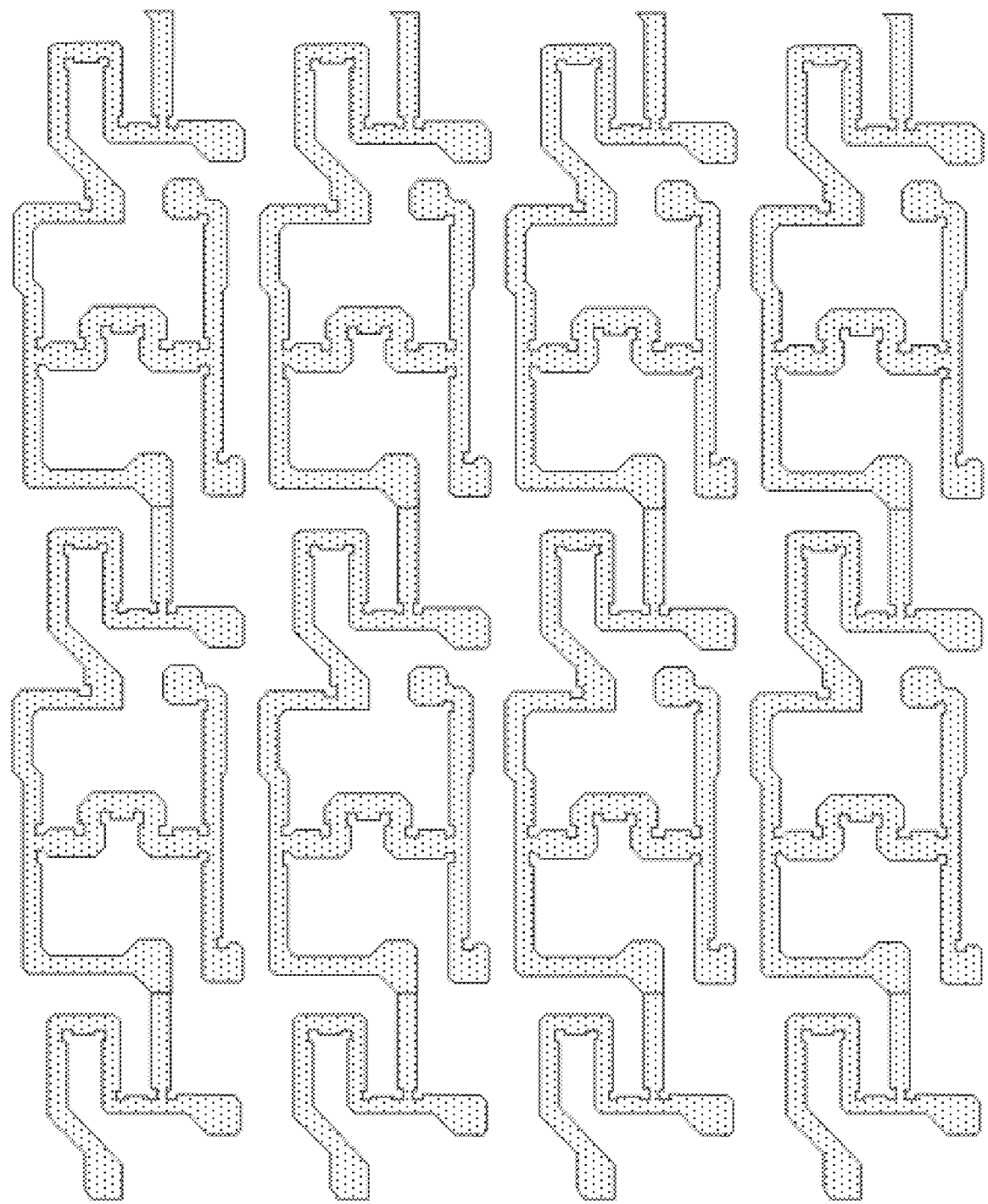
FIG. 16 is a schematic diagram of a layout of an active layer in FIG. 12.
Figure 17:
FIG. 17 is a schematic diagram of a layout of a first gate metal layer in FIG. 12.
Figure 17:
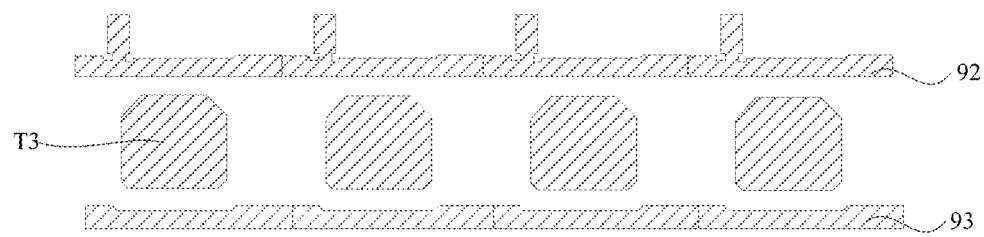
Figure 17:
Figure 17:
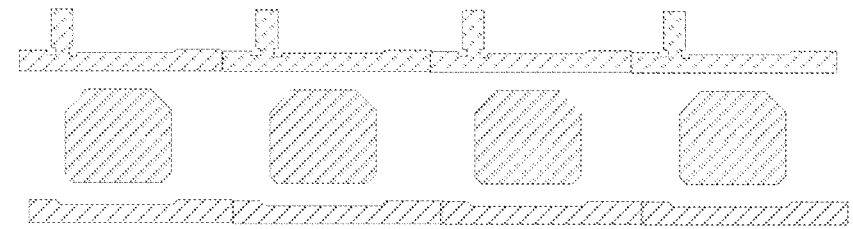
Figure 17:
Figure 18:
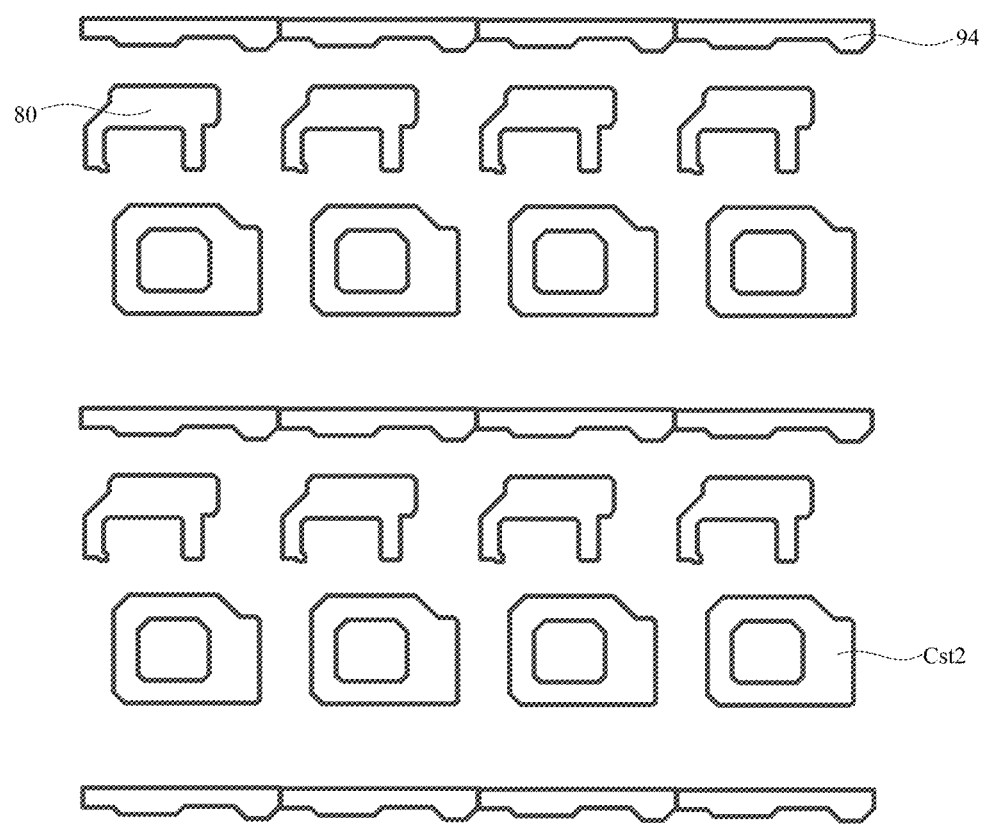
FIG. 18 is a schematic diagram of a layout of a second gate metal layer in FIG. 12.
Figure 19:
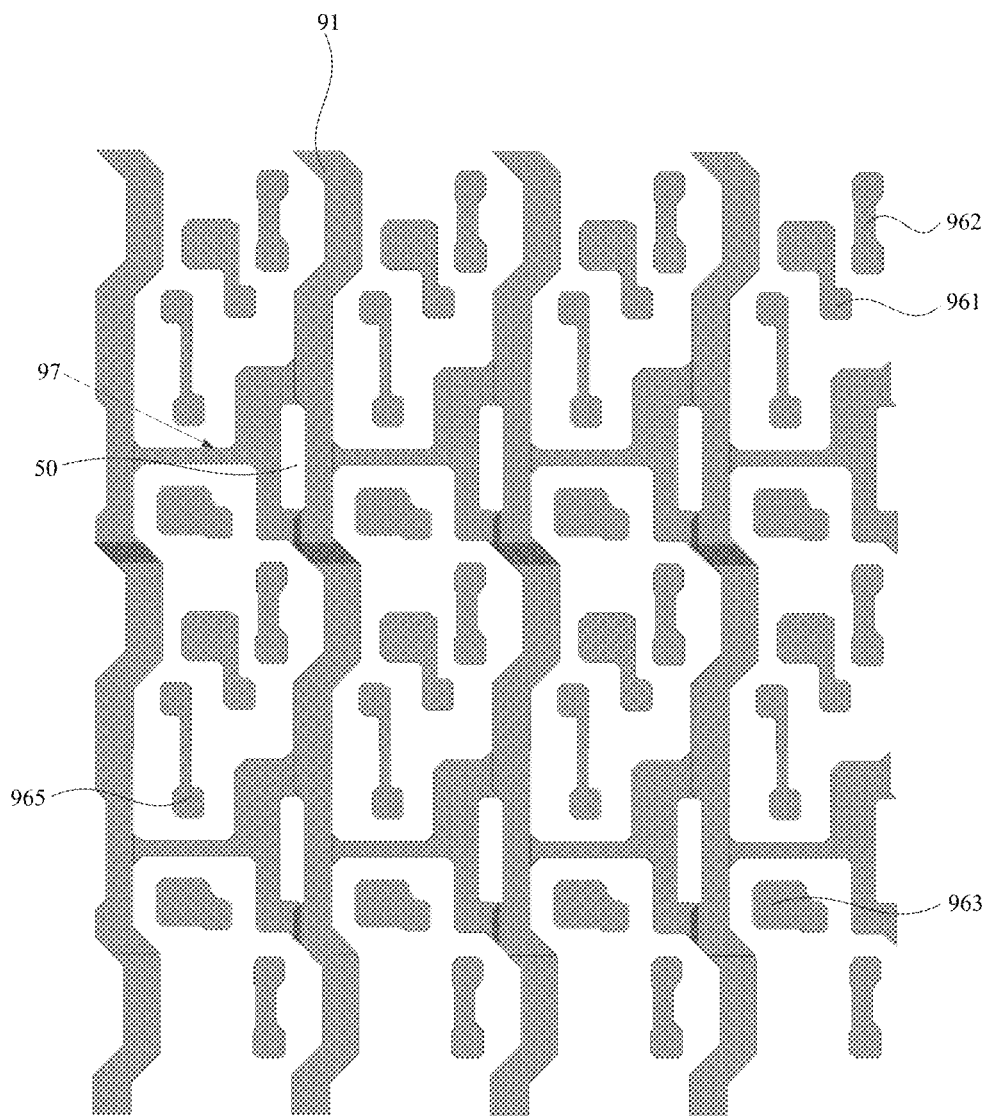
FIG. 19 is a schematic diagram of a layout of a first source-drain metal layer in FIG. 12.

It is worth noting that FIG. 16 is a schematic diagram of the layout of the active layer in FIG. 12; FIG. 17 is a schematic diagram of the layout of the first gate metal layer in FIG. 12; FIG. 18 is a schematic diagram of the layout of the second gate metal layer in FIG. 12; FIG. 19 is a schematic diagram of the layout of the first source-drain metal layer in FIG. 12. The active layer, the first gate metal layer, the second gate metal layer, and the first source-drain metal layer are sequentially stacked in a direction away from the substrate.

Figure 3:
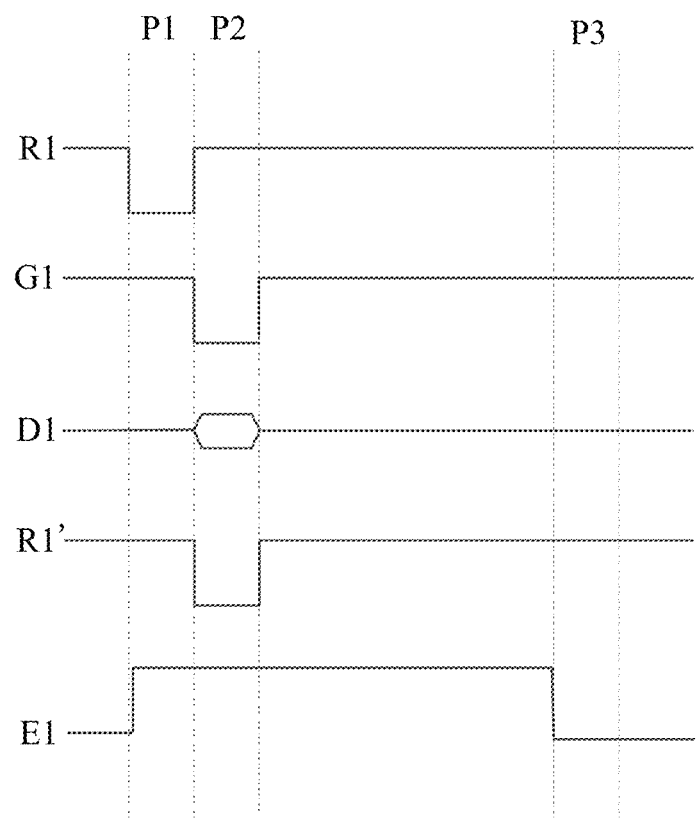
FIG. 3 is a working timing diagram of the sub-pixel driving circuit provided by an embodiment of the disclosure.
Figure 4:
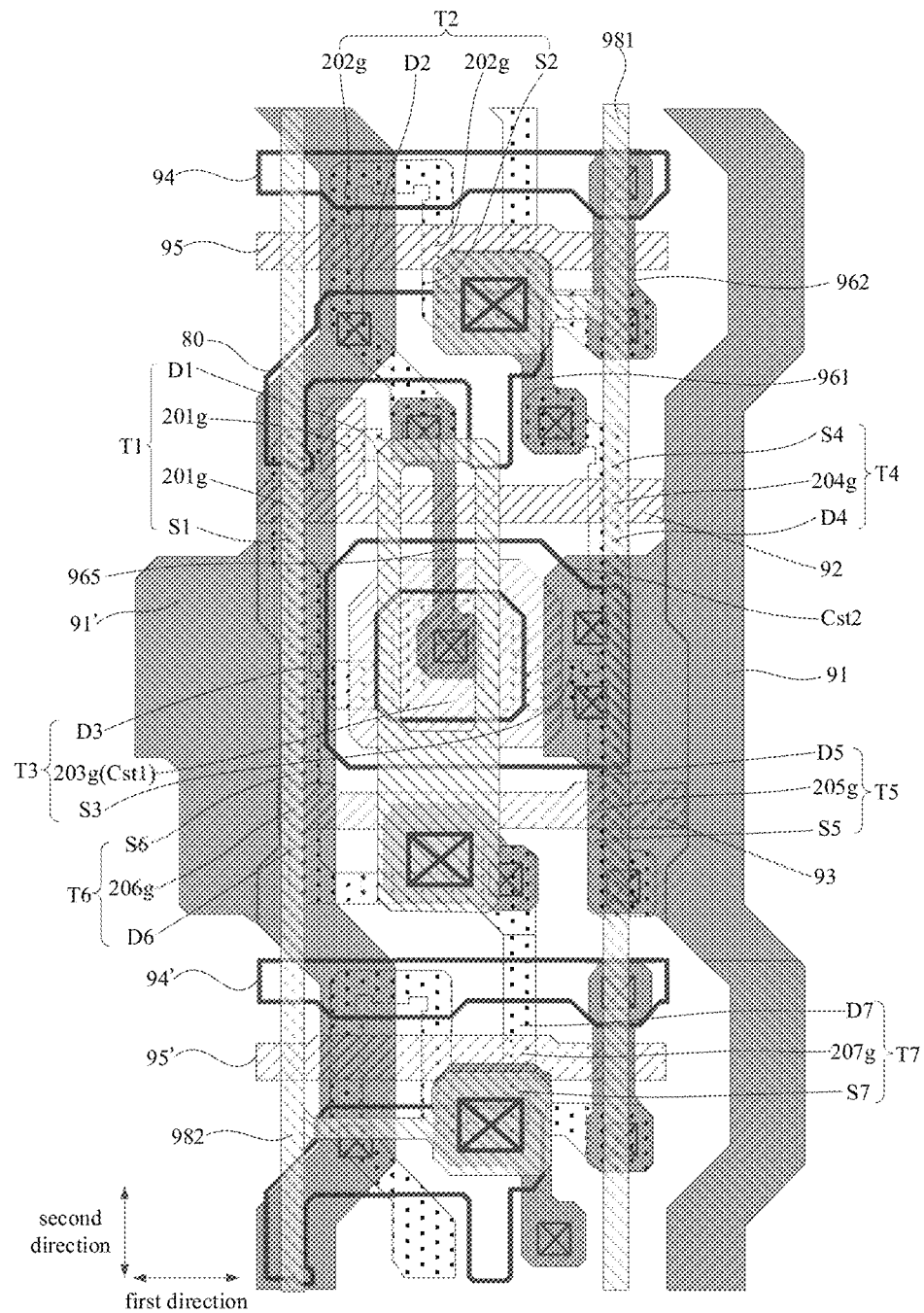
FIG. 4 is a schematic diagram of a first layout of sub-pixels provided by an embodiment of the disclosure.

Referring to FIGS. 2 to 4, the present disclosure provides a display substrate, including: a substrate and a plurality of sub-pixels arranged in an array on the substrate, the plurality of sub-pixels can be divided into a plurality of rows of sub-pixels arranged in sequence along the second direction, and a plurality of columns of sub-pixels arranged in sequence along the first direction, each sub-pixel includes: a light emitting element, an initialization signal line pattern 94, a reset signal line pattern 95, a gate line pattern 92, and a light emitting control signal line pattern 93.

The plurality of sub-pixels include: a first sub-pixel and a second sub-pixel alternately arranged along the second direction, the first sub-pixel includes a first data line pattern 981, the second sub-pixel includes a second data line pattern 982, and at least part of the first data line pattern 981 and at least part of the second data line pattern 982 extend along the second direction, and the first data line pattern 981 is located on a first side of the same column of the first sub-pixels extending along the second direction. The second data line pattern 982 is located on a second side of the same column of the second sub-pixels extending along the second direction, and the first side and the second side are opposite to each other along the first direction, the first direction intersects the second direction. Exemplarily, the first side is the right side in FIG. 4, and the second side is the left side in FIG. 4.

The first sub-pixel and the second sub-pixel each include a sub-pixel driving circuit, and the sub-pixel driving circuit includes a driving transistor (that is, a third transistor T3) and a data writing transistor (that is, a fourth transistor T4). In the first sub-pixel, the first electrode of the data writing transistor is electrically connected to the first data line pattern 981, and the second electrode of the data writing transistor is electrically connected to the first electrode of the driving transistor. In the second sub-pixel, the first electrode of the data writing transistor is electrically connected to the second data line pattern 982, and the second electrode of the data writing transistor is electrically connected to the first electrode of the driving transistor.

According to the specific structure of the above-mentioned display substrate, in the display substrate provided by the present disclosure, in the same column of sub-pixels extending along the second direction, a first electrode of a data writing transistor included in one of adjacent sub-pixels is electrically connected to the first data line pattern 981, and a first electrode of a data writing transistor included in the other of the adjacent sub-pixels is electrically connected to the second data line pattern 982. In the display substrate provided by the present disclosure, in the same column of sub-pixels, the data writing transistors in adjacent sub-pixels are electrically connected to different data line patterns, so that in the same column of sub-pixels, different data line patterns provide data signals to adjacent sub-pixels, thereby ensuring that each sub-pixel has enough data signal writing time, solving the problem of insufficient data signal writing time for each row of sub-pixels when the display substrate is displayed at high frequency.

However, in the above-mentioned display substrate, since the power signal line patterns included in each row of sub-pixels are independent of each other, the display uniformity of the display substrate is poor, which is not conducive to improving the display image quality of the display substrate.

Referring to FIGS. 5, 12, 13c, and 13d, an embodiment of the present disclosure provides a display substrate, including: a substrate and a plurality of sub-pixels arranged in an array on the substrate, the plurality of sub-pixels include: a first sub-pixel M1 and a second sub-pixel M2 alternately arranged along the second direction. The first sub-pixel M1 includes a first data line pattern 981, and the second sub-pixel M2 includes a second data line pattern 982. At least part of the first data line pattern 981 and at least part of the second data line pattern 982 extend along the second direction, and the first data line pattern 981 is located on the first side of the same column of first sub-pixels extending along the second direction, the second data line pattern 982 is located on the second side of the same column of second sub-pixels extending along the second direction, the first side and the second side are opposite to each other along a first direction, the first direction intersects the second direction.

As shown in FIGS. 5, 8, 10, 12 and 19, the first sub-pixel M1 and the second sub-pixel M2 both include: a power line pattern 91, at least part of the power signal line pattern 91 extending along the second direction; a power compensation pattern 97, at least part of the power compensation pattern 97 extending along the first direction, and the power signal line pattern and the power compensation pattern are both located one side of the first data line pattern and the second data line pattern close to the substrate, the power compensation pattern 97 is electrically connected to the power signal line pattern 91 and a power signal line pattern 91 in an adjacent sub-pixel along the first direction.

Each sub-pixel includes the power signal line pattern 91, and at least part of the power signal line pattern 91 extends along the second direction. In the same column of sub-pixels, the power signal line patterns 91 included in the sub-pixels are electrically connected in sequence to form an integral structure.

The sub-pixel also includes a power compensation pattern 97. The power signal line pattern 91 and the power compensation pattern 97 are both located on a side of the first data line pattern 981 and the second data line pattern 982 close to the substrate. For example, the side of the first data line pattern 981 and the second data line pattern 982 close to the substrate are provided with an interlayer insulating layer ILD, the power compensation pattern 97 and the power signal line pattern 91 both are located on a surface of the interlayer insulating layer ILD away from the substrate. This arrangement allows the power signal line pattern 91 and the power compensation pattern 97 to be arranged on the same layer. When the power signal line pattern 91 and the power compensation pattern 97 are made of the same material, the power source signal line pattern 91 and the power compensation pattern 97 are formed in the same patterning process, which simplifies the manufacturing process of the display substrate and saves the manufacturing cost.

It should be noted that the power signal line pattern 91 and the power compensation pattern 97 may form the first source-drain metal layer in the display substrate. Of course, the first source-drain metal layer may also include other structures.

As shown in FIG. 5, the power compensation pattern 97 is electrically connected to the power signal line pattern 91 in the sub-pixel to which the power compensation pattern 97 belongs, and a power signal line pattern 91' in an adjacent sub-pixel along the first direction.

Exemplarily, the power compensation pattern 97 and the two power signal line patterns 91 electrically connected to the power compensation pattern 97 form an integral structure. It is worth noting that the integrated structure includes: the power compensation pattern 97 and the power signal line pattern 91 that are formed at the same time and in contact to each other through a single patterning process.

In the display substrate provided by the embodiment of the present disclosure, the power compensation pattern 97 is electrically connected to the power signal line pattern 91 in the sub-pixel to which the power compensation pattern 97 belongs, and the power signal line patterns 91' in an adjacent sub-pixel in the same row along the first direction, so that the power signal line patterns 91 included in the sub-pixels in the same row are electrically connected together, the overall resistance of the power signal line patterns 91 is reduced, it is beneficial to improve the display uniformity of the display substrate. At the same time, by arranging the power signal line patterns 91 in the sub-pixels in the same column to be electrically connected in sequence, all the power signal line patterns 91 included in the display substrate are formed into a mesh structure, thereby further improving the display uniformity of the display substrate.

In the display substrate provided by the embodiment of the present disclosure, the power compensation pattern 97 and the power signal line pattern 91 are both located on the surface of the interlayer insulating layer ILD of the display substrate away from the substrate, and the power signal line pattern 91 and the power compensation pattern 97 are formed as the first source-drain metal layer in the display substrate, so that the power signal line pattern 91 and the power compensation pattern 97 can be formed in the same patterning process. Therefore, the manufacturing process of the display substrate is simplified, and the manufacturing cost is saved. Moreover, since the power compensation pattern 97 and the power signal line pattern 91 are made of the same source-drain metal material, the resistance of the power compensation pattern 97 and the power signal line pattern 91 are both smaller, the display uniformity of the display substrate is improved.

In the display substrate provided by the embodiment of the present disclosure, all the power signal line patterns 91 are jointly formed into a mesh structure, which effectively improves the stability of the power signal transmitted by the power signal line pattern, and the power signal is provided to the source electrode of the driving transistor in the sub-pixel driving circuit, and the light emitting current generated by the sub-pixel driving circuit is $I_{oled}=k[(Vgs-Vth)]^2$, Vgs=Vg−Vs, Vg is a gate voltage of the driving transistor, and Vs is a source voltage of the driving transistor, Vth is the threshold voltage of the driving transistor. Therefore, the power signal is Vs it will affect the value of the light emitting current $I_{oled}$. Therefore, the above setting method improves the stability of the power signal line layer and the stability of the light emitting current $I_{oled}$ at the same time, and the occurrence of dynamic crosstalk is effectively avoided.

As shown in FIG. 5, FIG. 8, FIG. 10, FIG. 12, and FIG. 19, the third sub-pixel M3 and the fourth sub-pixel M4 both include: the power signal line pattern and the power compensation pattern. The power compensation pattern included in the third sub-pixel M3 is electrically connected to the power signal line pattern included in the third sub-pixel M3 and the power signal line pattern in an adjacent first sub-pixel M1 in the first direction. The power compensation pattern included in the fourth sub-pixel M4 is electrically connected to the power signal line pattern included in the fourth sub-pixel M4 and the power signal line pattern in an adjacent second sub-pixel M2 in the first direction.

Specifically, the third sub-pixel M3 and the fourth sub-pixel M4 both include: the power signal line pattern and the power compensation pattern, and the structure of the power signal line pattern is the same as the power signal line pattern in the first sub-pixel M1 and the second sub-pixel M2, and the structure of the power compensation pattern is the same as the structure of the power compensation pattern in the first sub-pixel M1 and the second sub-pixel M2.

Figure 8:
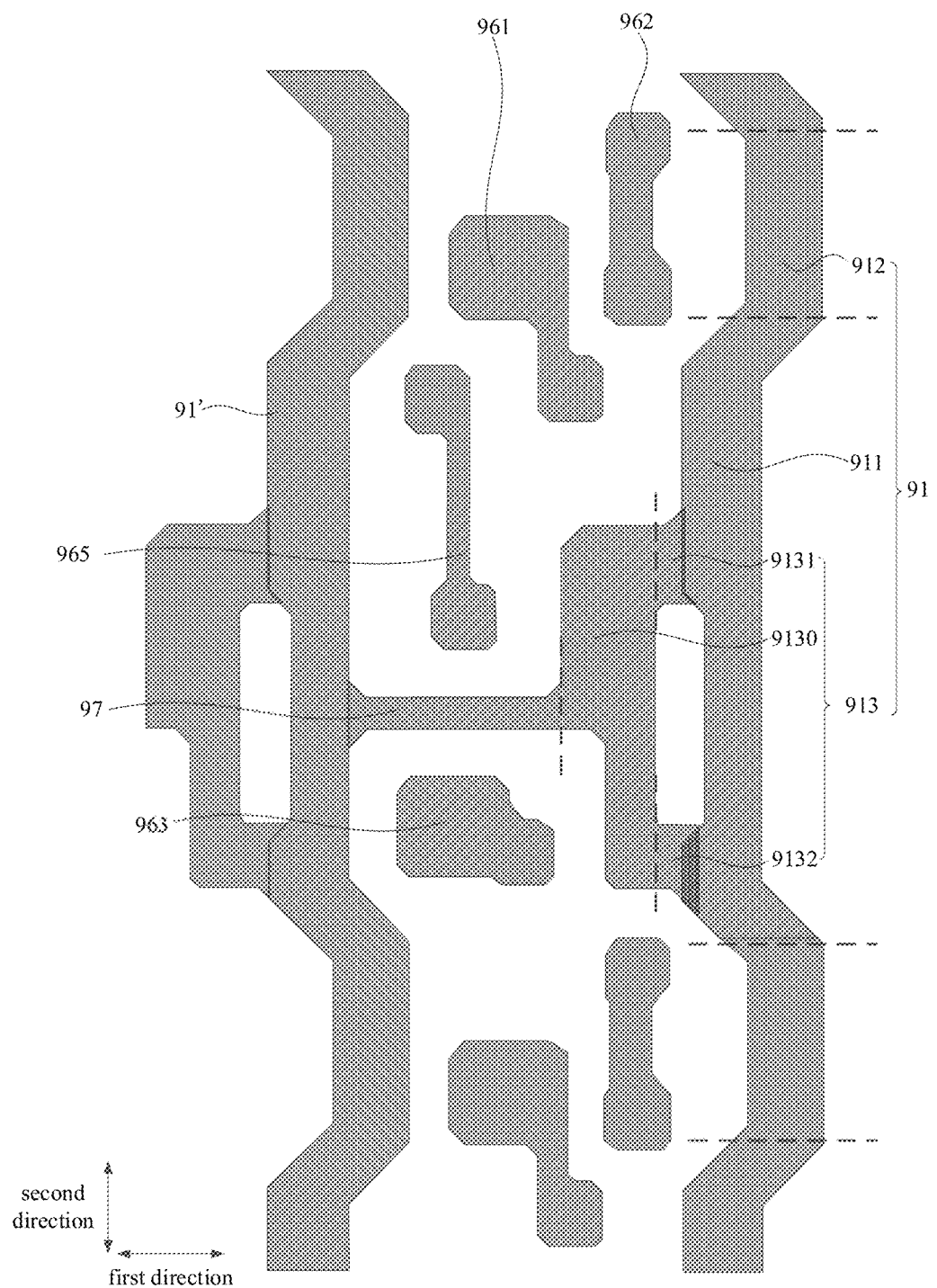
FIG. 8 is a schematic diagram of a layout of a first source-drain metal layer in FIG. 5.

As shown in FIGS. 5 and 8, in some embodiments, the first sub-pixel M1, the second sub-pixel M2, the third sub-pixel M3, and the fourth sub-pixel M4 all include: a reset signal line pattern 95, a gate line pattern 92 and a light emitting control signal line pattern 93 arranged along the second direction; at least part of the reset signal line pattern 95 extends along the first direction, and at least part of the gate line pattern 92 extends along the first direction, at least part of the light emitting control signal line pattern 93 extends along the first direction.

In the first sub-pixel M1, the second sub-pixel M2, the third sub-pixel M3, and the fourth sub-pixel M4, the orthographic projection of the power compensation pattern 97 on the substrate is located between the orthographic projection of the gate line pattern 92 on the substrate and the orthographic projection of the light emitting control signal line pattern 93 on the substrate.

Specifically, the sub-pixel further includes: a reset signal line pattern 95, a gate line pattern 92, and a light-emission control signal line pattern 93 sequentially arranged along the second direction. The reset signal line is used to transmit a reset signal, and the gate line pattern 92 is used to transmit a scan signal. The light emitting control signal line pattern 93 is used to transmit a light emitting control signal.

At least part of the reset signal line pattern 95 extends along the first direction, and the reset signal line patterns 95 included in the same row of sub-pixels along the first direction are electrically connected in sequence to form an integral structure. At least part of the gate line pattern 92 extends along the first direction, and the gate line patterns 92 included in the same row of sub-pixels along the first direction are electrically connected in sequence to form an integral structure. At least part of the light emitting control signal line pattern 93 extends along a first direction, and the light emitting control signal line patterns 93 included in the same row of sub-pixels along the first direction are electrically connected in sequence to form an integral structure.

The specific layout positions of the power compensation pattern 97 are various, for example, in the first sub-pixel M1, the second sub-pixel M2, the third sub-pixel M3, and the fourth sub-pixel M4, the orthographic projection of the power compensation pattern 97 on the substrate does not overlap the orthographic projection of the reset signal line pattern 95 on the substrate, and the orthographic projection of the power compensation pattern 97 on the substrate does not overlap the orthographic projection of the gate line pattern 92 on the substrate, the orthographic projection of the power compensation pattern 97 on the substrate does not overlap the orthographic projection of the light emitting control signal line pattern 93 on the substrate.

Exemplarily, the orthographic projection of the power compensation pattern 97 on the substrate is arranged between the orthographic projection of the gate line pattern 92 on the substrate and the orthographic projection of the light emitting control signal line pattern 93 on the substrate.

Exemplarily, along the second direction, the minimum distance between the orthographic projection of the power compensation pattern 97 on the substrate and the orthographic projection of the gate line pattern 92 on the substrate is greater than the minimum distance between the orthographic projection of the power compensation pattern 97 on the substrate and the orthographic projection of the light emitting control signal line pattern 93 on the substrate.

The power compensation pattern 97 is laid out in the above method, so that the power compensation pattern 97 has a relatively long distance to the reset signal line pattern 95, the gate line pattern 92, and the light emitting control signal line pattern 93, thereby avoiding the increase of the loads of the reset signal line pattern 95, the gate line pattern 92 and the light emitting control signal line pattern 93.

In some embodiments, the minimum distance between the orthographic projection of the power compensation pattern 97 on the substrate and the orthographic projection of the gate line pattern 92 on the substrate is greater than a threshold; the minimum distance between the orthographic projection of the power compensation pattern 97 on the substrate and the orthographic projection of the light emitting control signal line pattern 93 on the substrate is greater than the threshold.

Exemplarily, the threshold is 5 μm. The minimum distance between the orthographic projection of the power compensation pattern 97 on the substrate and the orthographic projection of the gate line pattern 92 on the substrate is greater than 5 μm; the minimum distance between the orthographic projection of the power compensation pattern 97 on the substrate and the orthographic projection of the light emitting control signal line pattern 93 on the substrate is greater than 5 μm.

In the above arrangement, the power compensation pattern 97 has a long distance to the reset signal line pattern 95, the gate line pattern 92 and the light emitting control signal line pattern 93, thereby avoiding the increase of the loads of the reset signal line pattern 95, the gate line pattern 92, and the light emitting control signal line pattern 93.

As shown in FIGS. 5, 8, 10, 12, and 19, in some embodiments, in the first sub-pixel M1, the second sub-pixel M2, the third sub-pixel M3, and the fourth sub-pixel M4, the power signal line pattern 91 in each sub-pixel includes: a power main body (including a first portion 911 and a second portion 912) and a power protruding portion 913 that are electrically connected.

A first end of the power compensation pattern 97 is electrically connected to the power protruding portion 913; a second end of the power compensation pattern 97 is electrically connected to the power main body in an adjacent sub-pixel along the first direction (the power main body of the power signal line pattern 91' in FIG. 8).

Exemplarily, at least part of the power protruding portion 913 extends along the second direction, and the second end of the power compensation pattern 97 is electrically connected to the middle portion of the power protruding portion 913.

The above arrangement method can shorten the length of the power compensation pattern 97, thereby effectively reducing the layout difficulty of the power compensation pattern 97.

As shown in FIGS. 5, 8, 10, 12, and 19, in some embodiments, at least part of the power protruding portion 913 extends along the second direction, and there is a gap 50 between the power protruding portion 913 and the power main body.

In more detail, the power protruding portion 913 includes a third portion 9130, a fourth portion 9131, and a fifth portion 9132. The third portion 9130 is electrically connected to the power compensation pattern 97, and the third portion 9130 extends along the second direction; the fourth portion 9131 is electrically connected to one end of the third portion 9130 and the power main body; the fifth portion 9132 is respectively electrically connected to the other end of the third portion 9130 and the power main body; a gap 50 is formed between the third portion 9130 and the power main body.

Specifically, the specific structure of the power protruding portion 913 is various. For example, the power protruding portion 913 includes the third portion 9130, the fourth portion 9131, and the fifth portion 9132 in an integral structure.

As described above, the fourth portion 9131 is electrically connected to one end of the third portion 9130 and the power main body; the fifth portion 9132 is electrically connected to the other end of the third part 9130 and the power main body respectively, thereby ensuring the connection performance between the power protruding portion 913 and the power main body, and more effectively improving the display uniformity of the display substrate.

In addition, the display substrate may also include a fingerprint identification module. Exemplarily, the fingerprint identification module is located on a side of the substrate away from the sub-pixel driving circuit. Exemplarily, the orthographic projection of the fingerprint identification area of the fingerprint identification module on the substrate overlaps the orthographic projection of the gap 50 on the substrate. During fingerprint identification, the finger touches the side of the light emitting element away from the substrate, and the light reflected by the finger can be received by the fingerprint identification module through the gap 50 to realize the fingerprint identification function.

The gap 50 is set between the third portion 9130 and the power main body, thereby improving the light transmittance of the display substrate. Therefore, when the optical fingerprint identification technology is applied to the display substrate provided in the above embodiment, it can provide good conditions for the sensor to collect light signals, thereby effectively improving the speed and accuracy of fingerprint identification.

In addition, in the display substrate provided by the above embodiment, the gap 50 is only formed on the power signal line pattern 91, and the width of the metal trace line other than the power signal line pattern 91 is not reduced, and the size of the light emitting element is not reduced, and the size of the transistor or the capacitor is not reduced. Therefore, the display substrate provided by the above embodiment improves the resolution while not negatively affecting the performance of the display substrate.

Figure 9:
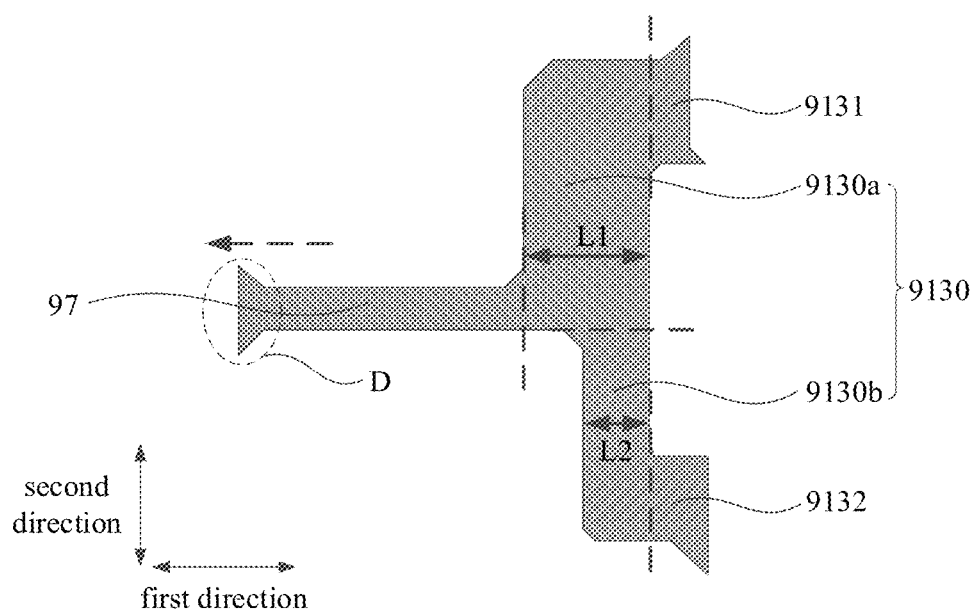
FIG. 9 is a structural schematic diagram of a power compensation pattern in FIG. 5.

As shown in FIGS. 5 and 9, in some embodiments, the first sub-pixel M1, the second sub-pixel M2, the third sub-pixel M3, and the fourth sub-pixel M4 all include: a storage capacitor Cst and a driving transistor. In each sub-pixel, the first electrode plate Cst1 of the storage capacitor Cst is electrically connected to the gate electrode of the driving transistor, and the second electrode plate Cst2 of the storage capacitor Cst is electrically connected to the power protruding portion 913.

Exemplarily, the orthographic projection of the second electrode plate Cst2 of the storage capacitor Cst on the substrate overlaps the orthographic projection of the power protruding portion 913 on the substrate, and the second electrode plate Cst2 of the storage capacitor Cst is electrically connected to the power protruding portion at the overlapping position.

Exemplarily, the third portion 9130 includes a first sub-portion 9130*a* and a second sub-portion 9130*b*, the first sub-portion 9130*a* is close to the fourth portion 9131, and the second sub-portion 9130*b* is close to the fifth portion. On a plane parallel to the substrate and in a direction perpendicular to the second direction, the width L1 of the first sub-portion 9130*a* is greater than the width L2 of the second sub-portion 9130*b*.

The orthographic projection of the second electrode plate Cst2 of the storage capacitor Cst on the substrate overlaps the orthographic projection of the first sub-portion 9130*a* on the substrate, and the second electrode plate Cst2 of the storage capacitor Cst is electrically connected to the first sub-portion 9130*a* through a via hole provided at the overlapping position.

In the above arrangement, an overlapping area with a large area is formed between the second electrode plate Cst2 of the storage capacitor Cst and the first sub-portion 9130*a*, which is more conducive to reduce the layout difficulty of the via hole. It should be noted that the reference number 40 in FIG. 13*a* represents the substrate and some film layers (such as a buffer layer, an isolation layer, etc.) provided on the substrate.

As shown in FIGS. 5 and 9, in some embodiments, in a direction perpendicular to the first direction, the first end D of the power compensation pattern 97 has a first width, and along the direction close to the power signal line pattern in the sub-pixel to which the first sub-pattern belongs (that is, the direction pointed by the dotted line with an arrow in FIG. 9), the first width gradually increases.

In the above setting method, the connection between the power compensation pattern 97 and the power signal line pattern 91 has a better performance, a right-angle structure is avoided to be formed at the connection position between the power compensation pattern 97 and the power signal line pattern 91, which leads to the risk of static electricity.

As shown in FIGS. 5, 8, 10, and 12, in some embodiments, in the first sub-pixel M1, the orthographic projection of the power protruding portion 913 on the substrate overlaps the orthographic projection of the first data line pattern 981 on the substrate, and the orthographic projection of the power main body (including the first portion 911 and the second portion 912) on the substrate at least partially overlaps the orthographic projections of an adjacent data line pattern along the first direction (the third data line pattern 983) on the substrate.

Specifically, in the display substrate, each sub-pixel includes the power signal line pattern 91, and at least part of the power signal line pattern 91 extends along the second direction. In the same column of sub-pixels, the power signal line patterns 91 included in respective sub-pixels are electrically connected in sequence to form an integral structure. The specific structure of the power signal line pattern 91 is various. For example, the power signal line pattern 91 includes a first portion 911 and a second portion 912 that are electrically connected, the first portion 911 and the second portion 912 are alternately arranged. Exemplarily, the second portion 912 protrudes from the first portion 911 along the first direction.

Exemplarily, in the first sub-pixel M1, the orthographic projection of the first portion 911 on the substrate overlaps an orthographic projection of a data line main body 9801 of an adjacent third data line pattern 983 along the first direction are on the substrate, and the orthographic projection of the second portion 912 on the substrate does not overlap the orthographic projection of the data line main portion 9801 of the third data line pattern 983 on the substrate.

Exemplarily, at least part of the first portion 911 extends along the second direction, and at least part of the second portion 912 extends along the second direction, in a direction perpendicular to the second direction, a width of the first portion 911 is equal to a width of the second portion 912, or the width of the first portion 911 is greater than the width of the second portion 912, or the width of the first portion 911 is smaller than the width of the second portion 912.

In the display substrate provided by the foregoing embodiment, an overlapping area between the orthographic projection of the first data line pattern 981 on the substrate and the orthographic projection of a functional pattern with a fixed potential on the substrate is close to an overlapping area between the orthographic projection of a data line pattern adjacent to the first data line pattern 981 in the first direction on the substrate and the orthographic projection of the functional pattern with the fixed potential on the substrate. Therefore, the load difference between the first data line pattern 981 and an adjacent data line pattern along the first direction is effectively reduced.

It should be noted that the functional pattern with the fixed unit includes: a power signal line pattern 91, an initialization signal line pattern 94, and a conductive function pattern electrically connected to the power signal line pattern 91 or the initialization signal line pattern 94 (E.g., the second conductive connection portion 962) and so on.

As shown in FIG. 12, in some embodiments, in the second sub-pixel M2, the orthographic projection of the power protruding portion 913 on the substrate does not overlap the orthographic projection of the second data line pattern 982 on the substrate.

Exemplarily, in the second sub-pixel M2, the orthographic projection of the power protruding portion 913 on the substrate overlaps the orthographic projection of an extending portion of an adjacent first data line 981 in the second direction on the substrate.

As shown in FIG. 12, in some embodiments, in the third sub-pixel M3, the orthographic projection of the power protruding portion 913 on the substrate does not overlap the orthographic projection of the third data line pattern 983 on the substrate.

Exemplarily, in the third sub-pixel M3, the orthographic projection of the power protruding portion 913 on the substrate overlaps the orthographic projection of an extending portion of an adjacent fourth data line 984 in the second direction on the substrate.

As shown in FIG. 12, in some embodiments, in the fourth sub-pixel M4, the orthographic projection of the power protruding portion 913 on the substrate overlaps the orthographic projection of the fourth data line pattern 984 on the substrate, the orthographic projection of the power main body on the substrate overlaps the orthographic projection of the adjacent data line pattern (such as the second data line pattern 982) along the first direction on the substrate.

Exemplarily, in the fourth sub-pixel M4, the power main body includes a first portion 911 and a second portion 912, and the orthographic projection of the first portion 911 on the substrate overlaps the orthographic projection of the data line main body 9801 of the adjacent sixth data line pattern 986 along the first direction on the substrate, and the orthographic projection of the second portion 912 on the substrate does not overlap the orthographic projection of the data line main body 9801 of the sixth data line pattern 986 on the substrate.

In the display substrate provided by the above-mentioned embodiment, an overlapping area between the orthographic projection of the fourth data line pattern 984 on the substrate and the orthographic projection of the functional pattern with a fixed potential on the substrate is close to an overlapping area between the orthographic projection of the sixth data line pattern 986 on the substrate and the orthographic projection of the functional pattern with a fixed potential on the substrate, thereby effectively reducing the load difference between the fourth data line pattern 984 and the sixth data line pattern 986. It is worth noting that FIG. 12 also shows that the fifth sub-pixel M5 further includes a fifth data line pattern 985, the seventh sub-pixel M7 further includes a seventh data line pattern 987, and the eighth sub-pixel further includes an eighth data line pattern 988.

In the display substrate provided by the foregoing embodiment, an overlapping area between the orthographic projection of the fourth data line pattern 984 on the substrate and the orthographic projection of the functional pattern with a fixed potential on the substrate is close to an overlapping area between the orthographic projection of a data line pattern adjacent to the fourth data line pattern 984 in the first direction on the substrate and the orthographic projection of the functional pattern with a fixed potential on the substrate. Therefore, the load difference between the fourth data line pattern 984 and the adjacent data line pattern along the first direction is effectively reduced.

Figure 10:
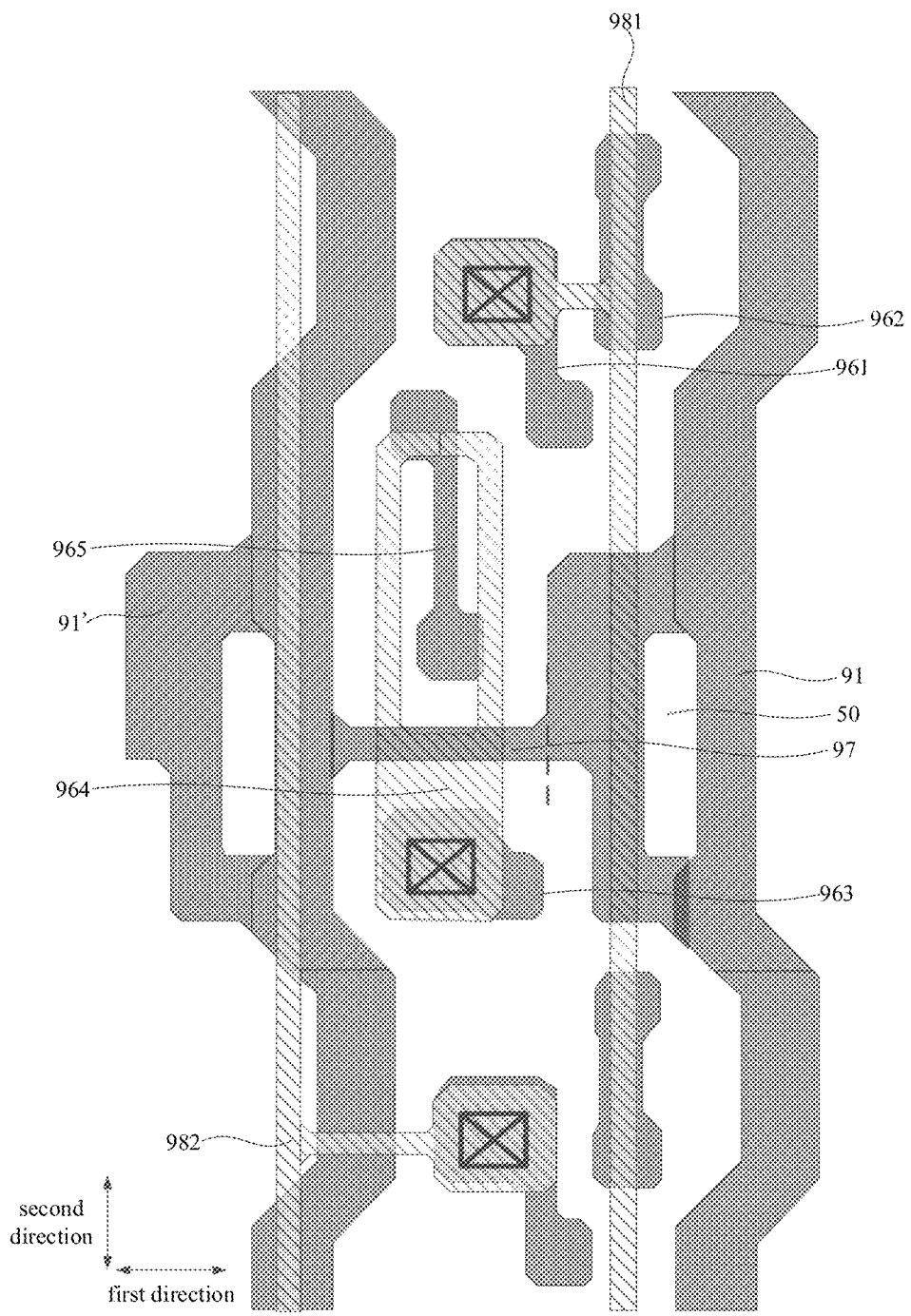
FIG. 10 is a schematic diagram of the layout of the first source-drain metal layer and the second source-drain metal layer in FIG. 5.
Figure 11:
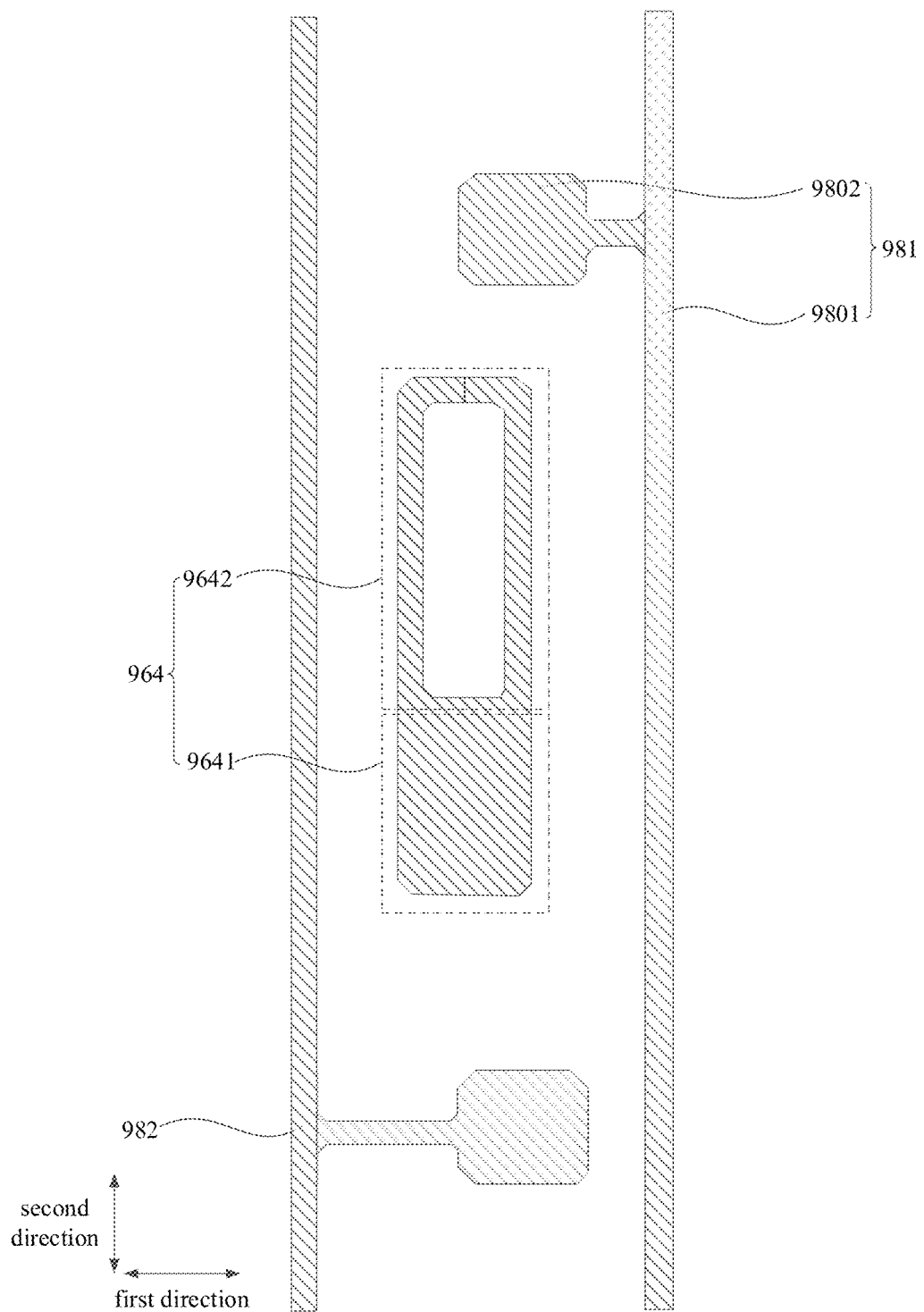
FIG. 11 is a schematic diagram of the layout of the second source-drain metal layer in FIG. 5.

As shown in FIGS. 10 and 11, in some embodiments, the first data line pattern 981, the second data line pattern 982, the third data line pattern 983, and the fourth data line pattern 984 each includes a data line main body 9801 and a data line protruding portion 9802, the data line main body 9801 extends along the second direction, and the data line protruding portion 9802 protrudes from the data line main body along the first direction 9801.

The first sub-pixel M1, the second sub-pixel M2, the third sub-pixel M3, and the fourth sub-pixel M4 all include a first conductive connection portion 961 and a data writing transistor. In the first sub-pixel M1, the second sub-pixel M2, the third sub-pixel M3, and the fourth sub-pixel M4, the data line protruding portion 9802 is electrically connected to the first electrode of the data writing transistor through the first conductive connection portion 961.

Exemplarily, at least part of the first conductive connection portion 961 extends along the second direction. The orthographic projection of the first end of the first conductive connection portion 961 on the substrate and the orthographic projection of the data line protruding portion 9802 on the substrate have a first overlapping area, and the first end of the first conductive connection portion 961 is electrically connected to the data line protruding portion 9802 through a via hole provided in the first overlapping area. The orthographic projection of the second end of the first conductive connection portion 961 on the substrate and the orthographic projection of the first electrode of the data writing transistor on the substrate have a second overlapping area. The second end of the first conductive connection portion 961 is electrically connected to the first electrode of the data writing transistor through a via hole provided in the second overlapping area, and the first electrode of the data writing transistor receives a data signal provided by the corresponding data line pattern through the first conductive connection portion 961.

Exemplarily, the orthographic projection of the second portion 912 of the power signal line pattern 91 on the substrate and the first overlapping area are arranged along the first direction.

Along the first direction, the distance between the first conductive connection portion 961 and the power signal line pattern 91 is relatively long, and the orthographic projection of the second portion 912 of the power signal line pattern 91 on the substrate and the first overlapping area are arranged along the first direction, so that the second portion 912 has sufficient layout space, thereby reducing layout difficulty of the display substrate while ensuring the second portion 912 has a larger area.

As shown in FIGS. 5, 10, and 12, in some embodiments, the first sub-pixel M1 and the second sub-pixel M2 each include: an initialization signal line pattern 94, a second transistor T2, and a second conductive connection portion 962.

At least part of the initialization signal line pattern 94 extends along the second direction, and the initialization signal line pattern 94 is used to transmit an initialization signal.

The first electrode of the second transistor T2 is electrically connected to the initialization signal line pattern 94 through the second conductive connection portion 962, and the second electrode of the second transistor T2 is electrically connected to the gate electrode of the driving transistor. In the first sub-pixel M1, the orthographic projection of the second conductive connection portion 962 on the substrate overlaps the orthographic projection of the first data line pattern 981 on the substrate. In the second sub-pixel M2, the orthographic projection of the second conductive connection portion 962 on the substrate does not overlap the orthographic projection of the second data line pattern 982 on the substrate.

As shown in FIG. 12, in some embodiments, the third sub-pixel M3 and the fourth sub-pixel M4 each include: an initialization signal line pattern 94, a second transistor T2, and a second conductive connection portion 962.

At least part of the initialization signal line pattern 94 extends along the second direction, and the initialization signal line pattern 94 is used to transmit an initialization signal.

The first electrode of the second transistor T2 is electrically connected to the initialization signal line pattern 94 through the second conductive connection portion 962, and the second electrode of the second transistor T2 is electrically connected to the gate electrode of the driving transistor.

In the third sub-pixel M3, the orthographic projection of the second conductive connection portion 962 on the substrate does not overlap the orthographic projection of the third data line pattern 983 on the substrate.

In the fourth sub-pixel M4, the orthographic projection of the second conductive connection portion 962 on the substrate overlaps the orthographic projection of the fourth data line pattern 984 on the substrate.

Specifically, the first sub-pixel M1, the second sub-pixel M2, the third sub-pixel M3, and the fourth sub-pixel M4 all include the initialization signal line pattern 94, the second transistor T2 and the second conductive connection portion 962. Exemplarily, the orthographic projection of the first electrode of the second transistor T2 on the substrate overlaps the orthographic projection of the first end of the second conductive connection portion 962 on the substrate, and the first electrode of the second transistor T2 and the first end of the second conductive connection portion 962 are electrically connected through a via hole located at the overlapping position. The orthographic projection of the second end of the second conductive connection portion 962 on the substrate overlaps the orthographic projection of the initialization signal line pattern 94 on the substrate. The second end of the second conductive connection portion 962 and the initialization signal line pattern 94 are electrically connected through a via hole located at the overlapping position.

The second electrode of the second transistor T2 is electrically connected to the gate electrode of the driving transistor. During the reset period, the second transistor T2 can transmit the received initialization signal to the gate electrode of the driving transistor, so as to reset the gate electrode of the driving transistor.

Since the second conductive connection portion 962 is electrically connected to the initialization signal line pattern 94, the initialization signal line pattern 94 has a stable potential. In the first sub-pixel M1, the orthographic projection of the second conductive connection portion 962 on the substrate overlaps the orthographic projection of the first data line pattern 981 on the substrate; so that the overlapping area between the orthographic projection of the first data line pattern 981 on the substrate and the orthographic projection of the functional pattern with a fixed potential on the substrate is closer to the overlapping area between the orthographic projection of the third data line pattern on the substrate and the orthographic projection of the functional pattern with a fixed potential on the substrate, thereby further reducing the load difference between the first data line pattern 981 and the third data line pattern.

As described above, in the fourth sub-pixel M4, the orthographic projection of the second conductive connection portion 962 on the substrate overlaps the orthographic projection of the fourth data line pattern 984 on the substrate, so that the overlapping area between the orthographic projection of the second data line pattern 982 on the substrate and the orthographic projection of the functional pattern with a fixed potential on the substrate is closer to the overlapping area between the orthographic projection of the fourth data line pattern 984 on the substrate and the orthographic projection of the functional pattern with a fixed potential on the substrate, thereby further reducing the load difference between the second data line pattern 982 and the fourth data line pattern 984.

In some embodiments, the overlapping area between the orthographic projection of the third data line pattern on the substrate and the orthographic projection of the first portion 911 on the substrate has a first area. The overlapping area between the orthographic projection of the first data line pattern 981 on the substrate and the orthographic projection of the power protruding portion 913 on the substrate has a second area. The overlapping area between the orthographic projection of the first data line pattern 981 on the substrate and the orthographic projection of the second conductive connection portion 962 on substrate have a third area. The sum of the second area and the third area is approximately the same as the first area. The sum of the second area and the third area is set to be approximately the same as the first area, so that the load of the first data line pattern 981 is substantially the same as the load of the third data line pattern and the display uniformity of the display substrate is improved.

In some embodiments, the overlapping area between the orthographic projection of the second data line pattern on the substrate and the orthographic projection of the first portion 911 on the substrate has a first area. The overlapping area between the orthographic projection of the fourth data line pattern 984 on the substrate and the orthographic projection of the power protruding portion 913 on the substrate has a second area. The overlapping area between the orthographic projection of the fourth data line pattern 984 on the substrate and the orthographic projection of the second conductive connection portion 962 on the substrate have a third area. The sum of the second area and the third area is approximately the same as the first area. The sum of the second area and the third area is set to be approximately the same as the first area, so that the load of the second data line pattern 982 is substantially the same as the load of the fourth data line pattern 984, the display uniformity of the display substrate is improved.

As shown in FIGS. 5, 8, 9, 12, and 19, in some embodiments, the power protruding portion 913 includes a third portion 9130, a fourth portion 9131, and a fifth portion 9132; the third portion 9130 extends along the second direction. In the first sub-pixel M1, the orthographic projection of the third portion 9130 on the substrate overlaps the orthographic projection of the first data line pattern 981 on the substrate. In the fourth sub-pixel M4, the orthographic projection of the third portion 9130 on the substrate overlaps the orthographic projection of the fourth data line pattern 984 on the substrate.

In the first sub-pixel M1, by setting the length of the third portion 9130 along the second direction, the overlapping area between the first data line pattern 981 and the third portion 9130 can be controlled, thereby adjusting the load of the first data line pattern 981. In the third sub-pixel M3, by setting the length of the third portion 9130 along the second direction, the overlapping area between the fourth data line pattern 984 and the third portion 9130 can be controlled, thereby adjusting the load of the fourth data line pattern 984.

As shown in FIGS. 5, 12 and 13a, in some embodiments, the display substrate further includes an interlayer insulating layer ILD and a first planarization layer PLN1 that are sequentially stacked in a direction away from the substrate. The first data line pattern 981, the second data line pattern 982, the third data line pattern 983, and the fourth data line pattern 984 are all located on the surface of the first planarization layer PLN1 away from the substrate. The power signal line pattern 91 and the power compensation pattern 97 are both located on the surface of the interlayer insulating layer ILD away from the substrate.

Specifically, the first data line pattern 981, the second data line pattern 982, the third data line pattern 983, and the fourth data line pattern 984 are all located on the surface of the first planarization layer PLN1 away from the substrate, so that the first data line pattern 981, the second data line pattern 982, the third data line pattern 983, and the fourth data line pattern 984 are all arranged in the same layer. When the first data line pattern 981, the second data line pattern 982, the third data line pattern 983, and the fourth data line pattern 984 are made of the same material, the first data line pattern 981, the second data line pattern 982, the third data line pattern 983, and the fourth data line pattern 984 are formed in the same patterning process, thereby simplifying the production process of the display substrate and saving production cost.

It should be noted that the first data line pattern 981, the second data line pattern 982, the third data line pattern 983, and the fourth data line pattern 984 may form the second source-drain metal layer in the display substrate. It is worth noting that the second source-drain metal layer may also include other structures.

Figure 7:
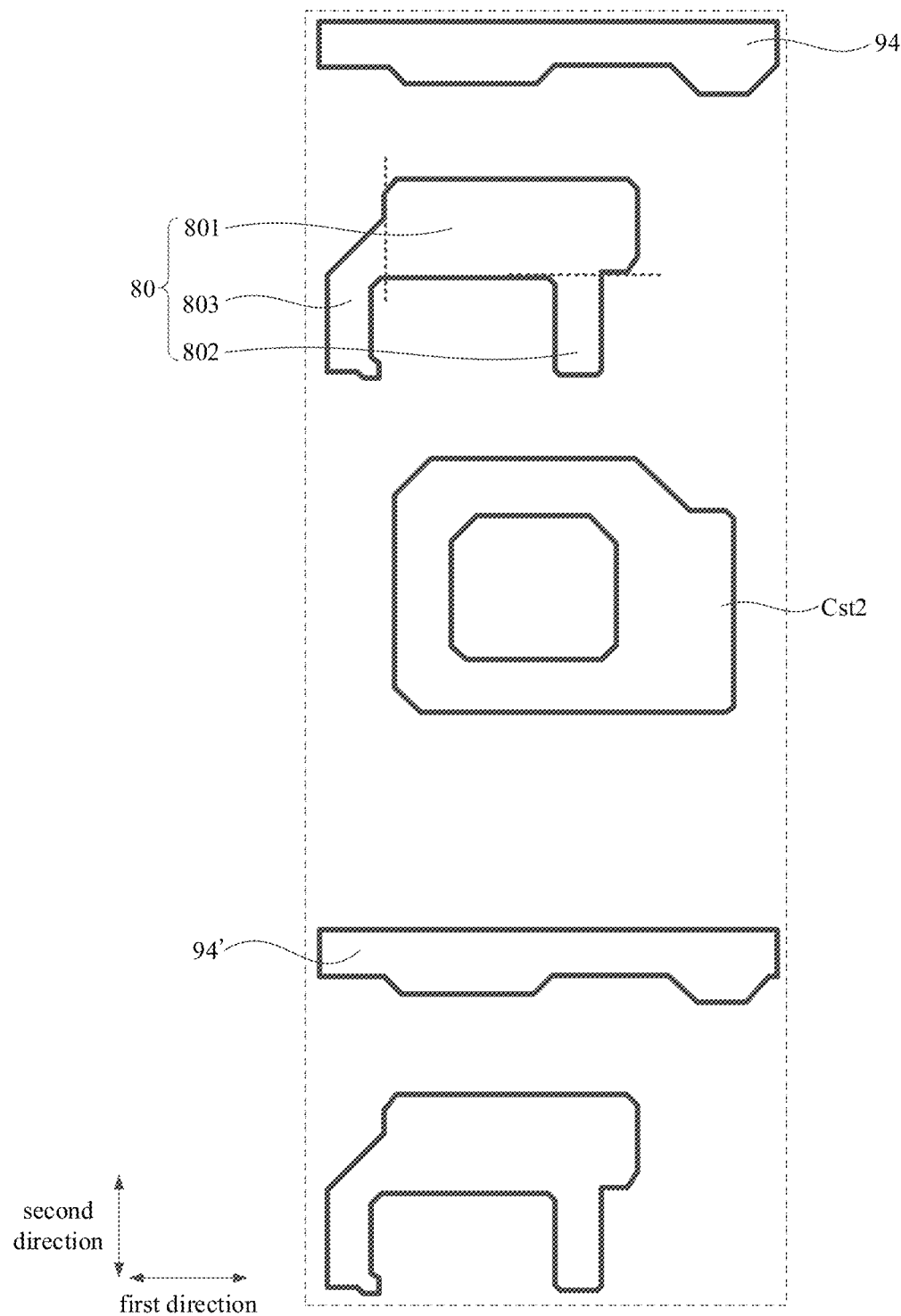
FIG. 7 is a schematic diagram of a layout of a second gate metal layer in FIG. 5.

As shown in FIGS. 5, 7 and 18, in some embodiments, the first sub-pixel M1, the second sub-pixel M2, the third sub-pixel M3, and the fourth sub-pixel M4 all include: an anode pattern, an initialization signal line pattern 94, a shielding pattern 80, a driving transistor, a second transistor T2.

In the first sub-pixel M1, the second sub-pixel M2, the third sub-pixel M3, and the fourth sub-pixel M4, the first electrode of the second transistor T2 is electrically connected to the initialization signal line pattern 94, and the second electrode of the second transistor T2 is electrically connected to the gate electrode of the driving transistor.

The shielding pattern 80 is electrically connected to the power signal line pattern 91, and the orthographic projection of the shielding pattern 80 on the substrate at least partially overlaps the orthographic projection of the first electrode of the second transistor T2 on the substrate.

Specifically, each of the sub-pixels further includes: an anode pattern, an initialization signal line pattern 94, a shielding pattern 80, a driving transistor, a second transistor T2, and a seventh transistor T7. The gate electrode of the second transistor T2 is electrically connected to the reset signal line pattern 95, the first electrode of the second transistor T2 is electrically connected to the initialization signal line pattern 94, the second electrode of the second transistor T2 is electrically connected to the gate electrode of the driving transistor. The second transistor T2 is used to reset the gate electrode of the driving transistor.

The gate electrode of the seventh transistor T7 is electrically connected to the reset signal line pattern 95' included in the next sub-pixel adjacent to the sub-pixel to which the seventh transistor T7 belongs along the second direction. The first electrode of the seventh transistor T7 is electrically connected to the initialization signal line pattern 94' in an adjacent next sub-pixel in the second direction, the second electrode of the seventh transistor T7 is electrically connected to the anode pattern in the sub-pixel, and the seventh transistor T7 is used to reset the anode pattern.

Each of the sub-pixels also includes a shielding pattern 80, and the orthographic projection of the shielding pattern 80 on the substrate overlaps the orthographic projection of the power signal line pattern 91 on the substrate, and the shielding pattern 80 is electrically connected to the power signal line pattern 91 through the via hole provided at the overlapping position. Exemplarily, the orthographic projection of the shielding pattern 80 on the substrate overlaps the orthographic projection of the second portion 912 of the power signal line pattern 91 on the substrate, and the shielding pattern 80 is electrically connected to the second portion 912 of the power signal line pattern 91 through the via hole provided at the overlapping position.

The shielding pattern 80 is electrically connected to the power signal line pattern 91, so that the shielding pattern 80 have a stable potential, which not only helps the sub-pixel driving circuit to be in a stable working state, but also better guarantees the shielding effect of the shielding pattern 80.

By setting the orthographic projection of the shielding pattern 80 on the substrate to overlap the orthographic projection of the first electrode of the second transistor T2 on the substrate, and/or, the orthographic projection of the shielding pattern 80 on the substrate to overlap the orthographic projection of the first electrode of the seventh transistor T7 in an adjacent sub-pixel in the second direction on the substrate, so that the shielding pattern 80 shields the influence of the data signal change on the first electrode of the second transistor T2 and/or the first electrode of the seventh transistor T7, thereby avoiding the influence on the initialization signal transmitted on the initialization signal line pattern 94.

As shown in FIGS. 5, 7 and 18, in some embodiments, the first sub-pixel M1, the second sub-pixel M2, the third sub-pixel M3, and the fourth sub-pixel M4 all include: a first conductive connection portion, a fifth conductive connection portion 965 and a data writing transistor.

In the first sub-pixel M1, the second sub-pixel M2, the third sub-pixel M3, and the fourth sub-pixel M4, the second electrode of the second transistor T2 is electrically connected to the gate electrode of the driving transistor through the fifth conductive connection portion 965.

The first conductive connection portion 961 is electrically connected to the first electrode of the data writing transistor; the second electrode of the data writing transistor is electrically connected to the first electrode of the driving transistor.

The orthographic projection of the shielding pattern 80 on the substrate at least partially overlaps the orthographic projection of the first conductive connection portion 961 on the substrate.

Specifically, in each sub-pixel, at least part of the fifth conductive connection portion 965 extends along the second direction. The orthographic projection of one end of the fifth conductive connection portion 965 on the substrate and the orthographic projection of the second electrode of the second transistor T2 on the substrate have a sixth overlapping area, and one end of the fifth conductive connection portion 965 is electrically connected to the second electrode of the second transistor T2 through a via hole provided in the sixth overlapping area, and the orthographic projection of the other end of the fifth conductive connection portion 965 on the substrate overlaps the orthographic projection of the gate electrode of the driving transistor on the substrate, and the other end of the fifth conductive connection portion 965 is electrically connected to the gate electrode of the driving transistor through a via hole provided at the overlapping position.

Each of the sub-pixels further includes a first conductive connection portion 961. For example, at least part of the first conductive connection portion 961 extends along the second direction. The orthographic projection of the first end of the first conductive connecting portion 961 on the substrate and the orthographic projection of the corresponding data line protruding portion 9802 on the substrate have a first overlapping area, and the first end of the first conductive connecting portion 961 is electrically connected to the data line protruding portion 9802 through the via hole provided in the first overlapping area. The orthographic projection of the second end of the first conductive connection portion 961 on the substrate and the orthographic projection of the first electrode of the data writing transistor on the substrate have a second overlapping area. The second end of the first conductive connection portion 961 is electrically connected to the first electrode of the data writing transistor through the via hole provided in the second overlapping area, and the first electrode of the data writing transistor receives the data signal provided by the corresponding data line pattern through the first conductive connection portion 961.

Exemplarily, the shielding pattern 80 includes a first shielding portion 801 and a second shielding portion 802 that are electrically connected to each other, and the orthographic projection of the first shielding portion 801 on the substrate overlaps the orthographic projection of the power signal line pattern 91 on the substrate, and the first shielding portion 801 is directly electrically connected to the power signal line pattern 91 through a via hole provided at the overlapping position.

Exemplarily, the first shielding portion 801 and the second shielding portion 802 are formed as an integral structure.

Exemplarily, the first shielding portion 801 has a square structure extending along the first direction, and the orthographic projection of the first shielding portion 801 on the substrate overlaps the orthographic projection of the first electrode of the second transistor T2 on the substrate, and/or, the orthographic projection of the first shielding portion 801 on the substrate overlaps the orthographic projection of the first electrode of the seventh transistor T7 in the adjacent sub-pixel along the second direction on the substrate.

Exemplarily, the orthographic projection of the first shielding portion 801 on the substrate does not overlap the orthographic projection of the reset signal line pattern 95 on the substrate.

Exemplarily, the orthographic projection of the first shielding portion 801 in the shielding pattern 80 on the substrate at least partially overlaps the orthographic projection of the first conductive connecting portion 961 on the substrate.

As shown in FIG. 5, in some embodiments, the orthographic projection of at least part of the shielding pattern 80 on the substrate is located between the orthographic projection of the first conductive connection portion 961 on the substrate and the orthographic projection of the fifth conductive connection portion 965 on the substrate.

Figure 13B:
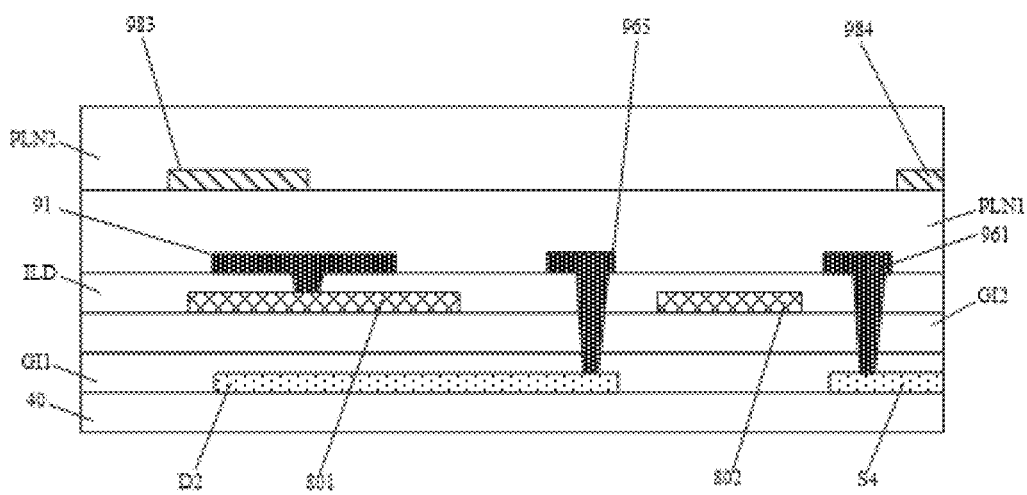
FIG. 13b is a schematic cross-sectional view along the direction B1-B2 in FIG. 12.
Figure 13C:
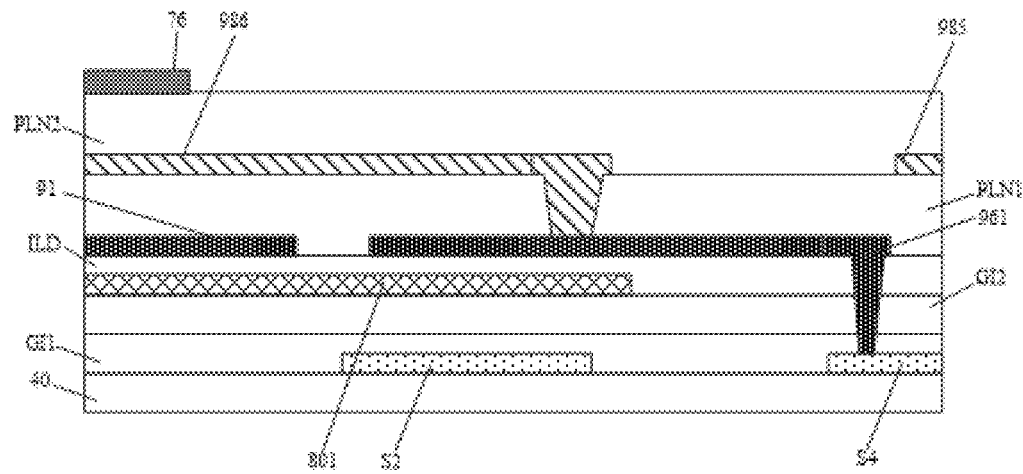
FIG. 13c is a schematic cross-sectional view along the direction C1-C2 in FIG. 12.
Figure 13D:
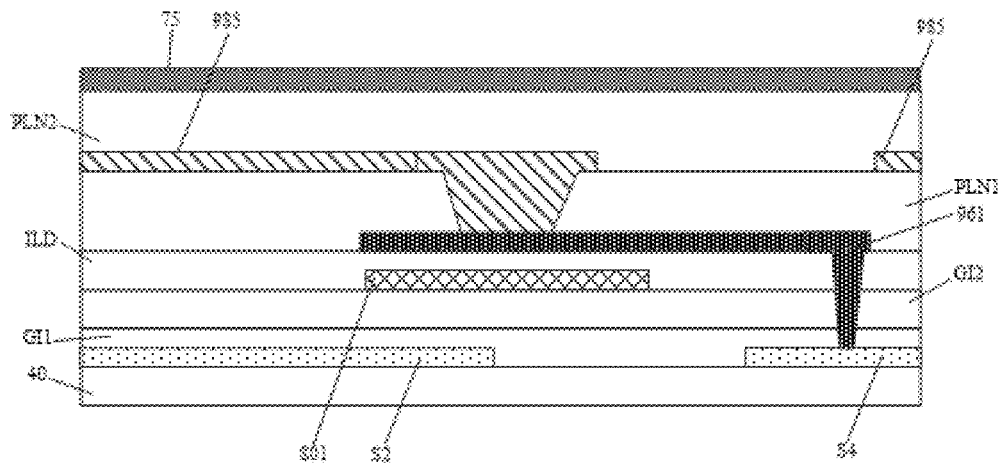
FIG. 13d is a schematic cross-sectional view along the direction D1-D2 in FIG. 12.
Figure 14:
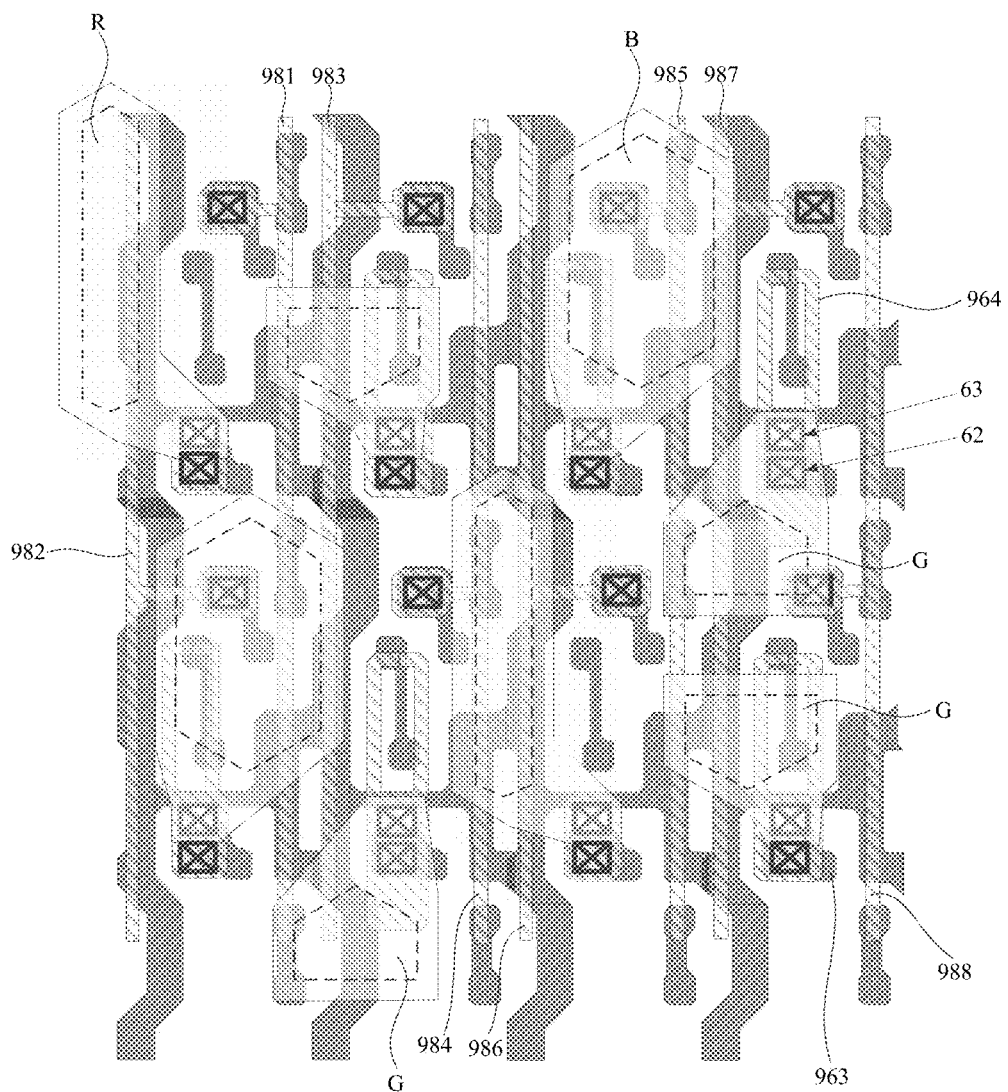
FIG. 14 is a schematic diagram of the layout of two source-drain metal layers and an anode layer in FIG. 12.

Exemplarily, as shown in FIG. 13*b*, the orthographic projection of the second shielding portion 802 in the shielding pattern 80 on the substrate is located between the second overlapping area and the sixth overlapping area.

Exemplarily, the second shielding portion 802 is a square structure extending along the second direction.

The above arrangement enables the second shielding portion 802 to better shield the influence of the data signal change on the second electrode of the second transistor T2, thereby avoiding the influence of the data signal change on the gate signal of the driving transistor. Since the gate signal of the driving transistor directly affects the brightness of the sub-pixel, the above arrangement makes the gate potential of the driving transistor more stable, so that a better display effect can be obtained when the display substrate is used for display.

As shown in FIGS. 5, 7 and 18, in some embodiments, the first sub-pixel M1, the second sub-pixel M2, the third sub-pixel M3, and the fourth sub-pixel M4 all include a first transistor T1.

In each sub-pixel, the first electrode of the first transistor T1 is electrically connected to the second electrode of the driving transistor, and the second electrode of the first transistor T1 is electrically connected to the gate electrode of the driving transistor.

The active pattern of the first transistor T1 includes two semiconductor portions arranged at intervals, and a first conductor portion respectively connected to the two semiconductor portions.

The orthographic projection of the shielding pattern 80 on the substrate also at least partially overlaps the orthographic projection of the first conductor portion on the substrate.

Specifically, each of the sub-pixels further includes a first transistor T1, the gate electrode of the first transistor T1 is electrically connected to the gate line pattern 92, and the first electrode of the first transistor T1 is connected to the second electrode of the driving transistor. The second electrode of the first transistor T1 is electrically connected to the gate electrode of the driving transistor.

The first transistor T1 is formed in a double-gate structure, and the active pattern of the first transistor T1 includes two semiconductor portions arranged at intervals, and a first conductor portion respectively connected to the two semiconductor portions. The orthographic projection of the gate electrode of the first transistor T1 on the substrate covers the orthographic projection of the two semiconductor portions on the substrate, and the orthographic projection of the gate electrode of the first transistor T1 on the substrate does not overlap the orthographic projection of the first conductor portion on the substrate.

Exemplarily, the shielding pattern 80 further includes a third shielding portion 803 electrically connected to the first shielding portion 801, and at least part of the third shielding portion 803 is a square structure extending along the second direction.

Exemplarily, the first shielding portion 801 and the third shielding portion 803 are formed as an integral structure.

Exemplarily, the shielding pattern 80 further includes a third shielding portion 803 electrically connected to the first shielding portion 801, and the orthographic projection of the third shielding portion 803 on the substrate overlaps the orthographic projection of the first conductor portion on the substrate.

The orthographic projection of the third shielding portion 803 on the substrate overlaps the orthographic projection of the first conductor portion on the substrate. This arrangement allows the third shielding pattern 80 to shield the first conductor portion, avoids the influence of the data signal change on the first transistor T1, and avoids the influence of the data signal change on the gate electrode of the driving transistor.

In some embodiments, in a direction perpendicular to the substrate, the shielding pattern 80 is located between the first electrode of the second transistor T2 and the first conductive connection portion 961.

Exemplarily, the display substrate further includes a second gate insulating layer located between the first electrode of the second transistor T2 and the first conductive connection portion 961. In each sub-pixel, the initialization signal line pattern 94 and the shielding pattern 80 are both located on a surface of the second gate insulating layer away from the substrate.

The initialization signal line pattern 94 and the shielding pattern 80 are both located on the surface of the second gate insulating layer away from the substrate, so that the initialization signal line pattern 94 and the shielding pattern 80 are arranged on the same layer. When the initialization signal line pattern 94 and the shielding pattern 80 are made of the same material, the initialization signal line pattern 94 and the shielding pattern 80 can be formed in the same patterning process, thereby simplifying the manufacturing process of the display substrate, and saving the manufacturing cost.

As shown in FIGS. 2, 5, and 12, in some embodiments, the first sub-pixel M1, the second sub-pixel M2, the third sub-pixel M3, and the fourth sub-pixel M4 all include: a light emitting element, an initialization signal line pattern 94, a reset signal line pattern 95, a gate line pattern 92, and a light emitting control signal line pattern 93 and a power signal line pattern 91. At least part of the initialization signal line pattern 94, at least part of the reset signal line pattern 95, at least part of the gate line pattern 92 and at least part of the light emitting control signal line pattern 93 extend along the first direction, at least part of the power signal line pattern 91 extend along the second direction.

The first sub-pixel M1, the second sub-pixel M2, the third sub-pixel M3, and the fourth sub-pixel M4 further include: a first transistor T1, a second transistor T2, a driving transistor (such as a third transistor), a data writing transistor (such as a fourth transistor), a fifth transistor T5, a sixth transistor T6, a seventh transistor T7, and a storage capacitor Cst.

In each sub-pixel, the gate electrode of the driving transistor is electrically connected to the second electrode of the first transistor T1, the first electrode of the driving transistor is electrically connected to the second electrode of the fifth transistor T5, the second electrode of the driving transistor is electrically connected to the first electrode of the first transistor T1.

The gate electrode of the first transistor T1 is electrically connected to the gate line pattern 92.

The gate electrode of the second transistor T2 is electrically connected to the reset signal line pattern 95, the first electrode of the second transistor T2 is electrically connected to the initialization signal line pattern 94, and the second electrode of the second transistor T2 is electrically connected to the gate electrode of the driving transistor.

The gate electrode of the data writing transistor is electrically connected to the gate line pattern 92, the first electrode of the data writing transistor is electrically connected to the data line pattern included in the sub-pixel, and the first electrode of the data writing transistor is electrically connected to the first electrode of the driving transistor.

The gate electrode of the fifth transistor T5 is electrically connected to the light emitting control signal line pattern 93, and the first electrode of the fifth transistor T5 is electrically connected to the power signal line pattern 91.

The gate electrode of the sixth transistor T6 is electrically connected to the light emitting control signal line pattern 93, the first electrode of the sixth transistor T6 is electrically connected to the second electrode of the driving transistor, and the second electrode of the sixth transistor T6 is electrically connected to the light emitting element.

The gate electrode of the seventh transistor T7 is electrically connected to the reset signal line pattern 95 in an adjacent next sub-pixel along the second direction, and the first electrode of the seventh transistor T7 is connected to the initialization signal line pattern 94 in the next adjacent sub-pixel along the second direction, and the second electrode of the seventh transistor T7 is electrically connected to the light emitting element.

The first electrode plate of the storage capacitor is multiplexed as the gate electrode of the driving transistor, and the second electrode plate of the storage capacitor is electrically connected to the power signal line pattern 91.

Exemplarily, each sub-pixel in the display substrate includes a sub-pixel driving circuit, and each sub-pixel driving circuit includes: a first transistor T1, a second transistor T2, a driving transistor (such as a third transistor), a data writing transistor (such as a fourth transistor), a fifth transistor T5, a sixth transistor T6, a seventh transistor T7, a storage capacitor Cst, a first conductive connection portion 961, a second conductive connection portion 962, a third conductive connection portion 963, a fourth conductive connection portion 964 and a fifth conductive connection portion 965 and so on.

Specifically, the plurality of sub-pixels can be divided into a plurality of rows of sub-pixels sequentially arranged along the second direction, and a plurality of columns of sub-pixels sequentially arranged along the first direction. The initialization signal line patterns 94 included in the same row of sub-pixels include are electrically connected in sequence to form an integral structure; the gate line patterns 92 included in the same row of sub-pixels are electrically connected in sequence to form an integral structure; the light emitting control signal line patterns 93 included in the same row of sub-pixels are electrically connected in sequence to form an integral structure; the reset signal line patterns 95 included in the same row of sub-pixels are electrically connected in sequence to form an integral structure; the first data line patterns 981 included in the same column of sub-pixels are electrically connected in sequence to form an integral structure; the second data line patterns 982 included in the same column of sub-pixels are electrically connected in sequence to form an integral structure; the power signal line patterns 91 included in the same column of sub-pixels are electrically connected in sequence to form an integral structure.

As shown in FIG. 2, taking a sub-pixel driving circuit as an example, the sub-pixel driving circuit includes seven thin film transistors and one capacitor. Each transistor included in the sub-pixel driving circuit is a P-type transistor, the first electrode of each transistor includes a source electrode, and the second electrode of each transistor includes a drain electrode.

The first transistor T1 has a double-gate structure, the gate electrode 201g of the first transistor T1 is electrically connected to the gate line pattern 92, and the source electrode S1 of the first transistor T1 is electrically connected to the drain electrode D3 of the third transistor T3 (that is, the driving transistor), the drain electrode D1 of the first transistor T1 is electrically connected to the gate electrode 203g of the third transistor T3.

The second transistor T2 has a double-gate structure. The gate electrode 202g of the second transistor T2 is electrically connected to the reset signal line pattern 95, and the source electrode S2 of the second transistor T2 is electrically connected to the initialization signal line pattern 94. The drain electrode D2 of T2 is electrically connected to the gate electrode 203g of the third transistor T3.

The gate electrode 204g of the fourth transistor T4 (that is, the data writing transistor) is electrically connected to the gate line pattern 92, and the source electrode S4 of the fourth transistor T4 is electrically connected to the first data line pattern 981 or the second data line pattern 982, the drain electrode D4 of the fourth transistor T4 is electrically connected to the source electrode S3 of the third transistor T3.

The gate electrode 205g of the fifth transistor T5 is electrically connected to the light emitting control signal line pattern 93, the source electrode S5 of the fifth transistor T5 is electrically connected to the power signal line pattern 91, and the drain electrode D5 of the fifth transistor T5 is electrically connected to the source electrode S3 of the third transistor T3.

The gate electrode 206g of the sixth transistor T6 is electrically connected to the light emitting control signal line pattern 93, the source electrode S6 of the sixth transistor T6 is electrically connected to the drain electrode D3 of the third transistor T3, and the drain electrode D6 of the sixth transistor T6 is electrically connected to the anode of the light emitting element EL.

The gate electrode 207g of the seventh transistor T7 is electrically connected to the reset signal line pattern 95' in an adjacent next sub-pixel in the second direction, and the drain electrode D7 of the seventh transistor T7 is electrically connected to the anode of the corresponding light emitting element EL. The source electrode S7 of the seventh transistor T7 is electrically connected to the initialization signal line pattern 94' in an adjacent next sub-pixel in the second direction.

The first electrode plate Cst1 of the storage capacitor Cst is multiplexed as the gate electrode 203g of the third transistor T3, and the second electrode plate Cst2 of the storage capacitor Cst is electrically connected to the power signal line pattern 91.

As shown in FIG. 3, when the sub-pixel driving circuit of the above structure is in operation, each work cycle includes a reset period P1, a writing compensation period P2, and a light emitting period P3. In FIG. 3, E1 represents the light emitting control signal transmitted on the light emitting control signal line pattern 93 in the current sub-pixel, R1 represents a reset signal transmitted on the reset signal line pattern 95 in the current sub-pixel, and D1 represents the data signal transmitted on the data line pattern in the current sub-pixel, G1 represents a gate scan signal transmitted on the gate line pattern 92 in the current sub-pixel, and R1' represents the reset signal transmitted on the reset signal line pattern 95' in a next sub-pixel adjacent to the current sub-pixel in the second direction.

In the first reset period P1, the reset signal inputted by the reset signal line pattern 95 is at a valid level, the second transistor T2 is turned on, and the initialization signal transmitted by the initialization signal line pattern 94 is inputted to the gate electrode 203g of the third transistor T3, so that the gate-source voltage Vgs kept at the third transistor T3 in the previous frame is changed to zero, so as to reset the gate electrode 203g of the third transistor T3.

In the writing compensation period P2, the reset signal inputted from the reset signal line pattern 95 is at an invalid level, the second transistor T2 is turned off, and the gate scan signal inputted from the gate line pattern 92 is at a valid level, the first transistor T1 and the fourth transistor T4 are controlled to be turned on, a data signal is written by a corresponding data line pattern, and transmitted to the source electrode S3 of the third transistor T3 through the fourth transistor T4, and at the same time, the first transistor T1 and the fourth transistor T4 are turned on, the third transistor T3 is formed into a diode structure. Therefore, the first transistor T1, the third transistor T3, and the fourth transistor T4 work together to realize the threshold voltage compensation of the third transistor T3. When the compensation time is long enough, the potential of the gate electrode 203g of the third transistor T3 is controlled to finally reach Vdata+Vth, where Vdata represents a voltage value of the data signal, and Vth represents the threshold voltage of the third transistor T3.

In the writing compensation period P2, the reset signal inputted from the reset signal line pattern 95' is at a valid level, the seventh transistor T7 is controlled to be turned on, and the initialization signal transmitted by the initialization signal line pattern 94' is inputted to the anode of the light emitting element EL, so as to control the light emitting element EL to not emit light.

In the light emitting period P3, the light emitting control signal written by the light emitting control signal line pattern 93 is at a valid level, and the fifth transistor T5 and the sixth transistor T6 are controlled to be turned on, so that the power signal transmitted by the power signal line pattern 91 is inputted to the source electrode S3 of the transistor T3, and the gate electrode 203g of the third transistor T3 is kept at Vdata+Vth, so that the third transistor T3 is turned on. The corresponding gate-source voltage of the third transistor T3 is Vdata+Vth−VDD, and VDD is the voltage value corresponding to the power signal, the drain current generated based on the gate-source voltage flows to the anode of the corresponding light emitting element EL, so as to drive the corresponding light emitting element EL to emit light.

As shown in FIGS. 6-8 and FIGS. 10-13a, when the above sub-pixels are made, the layout of each layer corresponding to the sub-pixels is as follows.

The active film layer, the first gate insulating layer GI1, the first gate metal layer, the second gate insulating layer GI2, the second gate metal layer, the interlayer insulating layer ILD, a first source-drain metal layer, a first planarization layer PLN1, a second source-drain metal layer, a second planarization layer PLN2 and an anode layer are sequentially stacked in a direction away from the substrate.

Figure 6:
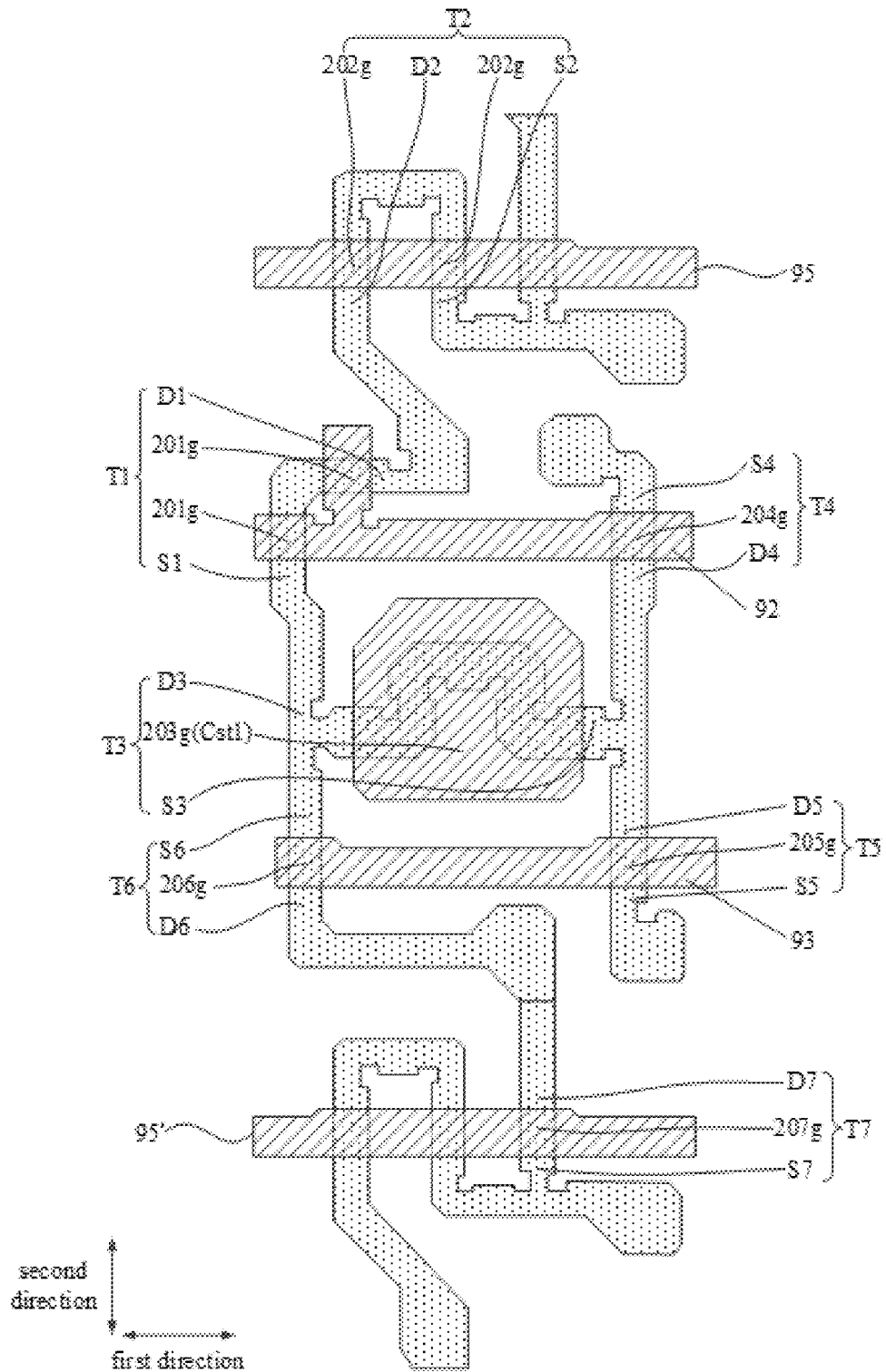
FIG. 6 is a schematic diagram of a layout of an active layer and a first gate metal layer in FIG. 5.

As shown in FIG. 6, the active film layer is used to form the channel region (the portion covered by the gate electrode of each transistor) of each transistor in the sub-pixel driving circuit, the source electrode (such as S1-S7) and the drain electrode (such as D1-D7). Due to the doping effect, the conductivity of the active film corresponding to the source electrode and drain electrode will be better than that of the active film corresponding to the channel region; the active film can be amorphous silicon, polysilicon, oxide semiconductor materials, etc. It should be noted that the aforementioned source electrode and drain electrode may be doped with n-type impurities or p-type impurities.

As shown in FIG. 6, the first gate metal layer is used to form the gate electrodes of the transistors in the sub-pixel driving circuit (for example, 201g-207g), and the gate line pattern 92, the light emitting control signal line pattern 93, and the reset signal line pattern 95 and other structures included in the sub-pixel, the gate electrode 203g of the third transistor T3 in each sub-pixel driving circuit is multiplexed as the first electrode plate Cst1 of the second storage capacitor Cst in the sub-pixel driving circuit.

As shown in FIG. 7, the second gate metal layer is used to form the second electrode plate Cst2 of the second storage capacitor Cst, the initialization signal line pattern 94 included in the sub-pixel, and the shielding pattern 80.

As shown in FIG. 8, the first source-drain metal layer is used to form the power signal line pattern 91, the power compensation pattern and some conductive connection portions included in the sub-pixel.

As shown in FIG. 11, the second source-drain metal layer is used to form the first data line pattern 981, the second data line pattern 982 and some conductive connection portions included in the sub-pixel.

In addition, as shown in FIG. 5, in the display substrate provided by the present disclosure, in the second direction, the gate electrode 204g of the fourth transistor T4, the gate electrode 201g of the first transistor T1, and the gate electrode 202g of the second transistor T2 are all located at the first side of the gate electrode of the driving transistor (that is, the gate electrode 203g of the third transistor T3). The gate electrode of the seventh transistor T7, the gate electrode 206g of the sixth transistor T6, and the gate electrode of the fifth transistor T5 are all located at the second side of the gate electrode of the driving transistor. Exemplarily, the first side and the second side of the gate electrode of the driving transistor are two sides opposite to each other along the second direction. Further, the first side of the gate opposite of the driving transistor may be the upper side of the gate opposite of the driving transistor. On the other hand, the second side of the gate opposite of the driving transistor may be the lower side of the gate opposite of the driving transistor. For example, a side of the display substrate for bonding the ICs is the lower side of the display substrate, and the lower side of the gate electrode of the driving transistor is a side of the gate electrode of the driving transistor closer to the ICs. The upper side is an opposite side of the lower side, for example, the side of the gate electrode of the driving transistor farther away from the ICs.

In the first direction, the gate electrode 204g of the fourth transistor T4 and the gate electrode 205g of the fifth transistor T5 are both located at a third side of the gate electrode of the driving transistor. The gate electrode 201g of the first transistor T1 and the gate electrode 206g of the sixth transistor T6 are both located at a fourth side of the gate electrode of the driving transistor. Exemplarily, the third side and the fourth side of the gate electrode of the driving transistor are opposite sides along the first direction; further, the third side of the gate electrode of the driving transistor may be the right side of the gate electrode of the driving transistor, the fourth side of the gate electrode of the driving transistor may be the left side of the gate electrode of the driving transistor. For the left and right sides, for example, in the same sub-pixel, the second data line pattern 982 is located at the right side of the gate electrode of the driving transistor, and the first data line pattern 981 is located at the left side of the gate electrode of the driving transistor.

The embodiments of the present disclosure also provide a display device, including the display substrate.

In the display substrate provided by the above embodiment, in the first sub-pixel M1, the orthographic projection of the anode pattern on the substrate at least partially overlaps the orthographic projection of the second data line pattern on the base, the orthographic projection of the anode pattern on the substrate at least partially overlaps the orthographic projection of a data line pattern adjacent to the second data line pattern along the first direction on the substrate; this enables the second data line pattern 982 and its adjacent data line pattern to compensate for the level difference generated below the anode pattern (such as the first anode pattern 71), so that the anode pattern can be formed on a relatively flat surface, the anode pattern has a relatively high flatness, which ensures that the sub-pixels have the same light emitting intensity in all directions, and effectively improves the color shift problem of the display product when the display substrate is applied to the display product.

Therefore, when the display device provided by the embodiment of the present disclosure includes the above-mentioned display substrate, it also has all the effects of the above-mentioned display substrate, which will not be repeated here.

It should be noted that the display device may be any product or component with a display function, such as a TV, a monitor, a digital photo frame, a mobile phone, a tablet computer, and so on.

The embodiments of the present disclosure also provide a method for manufacturing a display substrate, which is used to manufacture the display substrate provided in the above-mentioned embodiment. The manufacturing method includes: forming a plurality of sub-pixels arranged in an array on a substrate, and the plurality of sub-pixels includes: a first sub-pixel M1 and a second sub-pixel M2 arranged along the second direction. The first sub-pixel M1 includes a first data line pattern 981, and the second sub-pixel M2 includes a second data line pattern 982. The first data line pattern 981 is configured to provide a first data signal to the first sub-pixel M1, and the second data line pattern 982 is configured to provide a second data signal to the second sub-pixel M2.

At least part of the first data line pattern 981 and at least part of the second data line pattern 982 extend along the second direction, and the first data line pattern 981 is located on the first side of the same column of first sub-pixels M1 extending along the second direction. The second data line pattern 982 is located on the second side of the same column of second sub-pixels M2 extending along the second direction; the first side and the second side are opposite to each other along a first direction, and the first direction intersects the second direction.

The first sub-pixel M1 includes a sixth transistor T6, and a third conductive connecting portion 963, a fourth conductive connecting portion 964, and an anode pattern stacked in a direction away from the substrate; the second electrode of the sixth transistor T6 is electrically connected to the anode pattern through the third conductive connection portion 963 and the fourth conductive connection portion 964.

In the first sub-pixel M1, the orthographic projection of the anode pattern on the substrate at least partially overlaps the orthographic projection of the second data line pattern 982 on the substrate, and the orthographic projection of the anode pattern on the substrate at least partially overlaps the orthographic projection of a data line pattern adjacent to the second data line pattern 982 along the first direction on the substrate.

In the display substrate manufactured by the manufacturing method provided by the embodiment of the present disclosure, in the first sub-pixel M1, the orthographic projection of the anode pattern on the substrate at least partially overlaps the orthographic projection of the second data line pattern on the substrate, the orthographic projection of the anode pattern on the substrate at least partially overlaps the orthographic projection of a data line pattern adjacent to the second data line pattern along the first direction on the substrate; so that the second data line pattern 982 and its adjacent data line patterns can compensate for the step difference generated under the anode pattern (such as the first anode pattern 71), so that the anode pattern can be formed on a relatively flat surface, the anode pattern has a higher flatness, ensures that the sub-pixels have the same light emitting intensity in all directions, and effectively improves the color shift problem of the display product when the display substrate is applied to the display product.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a substrate and a plurality of sub-pixels arranged in an array on the substrate, wherein the plurality of sub-pixels includes:
a first sub-pixel and a second sub-pixel arranged along a second direction, the first sub-pixel includes a first data line pattern, and the second sub-pixel includes a second data line pattern, the first data line pattern is configured to provide a first data signal to the first sub-pixel, and the second data line pattern is configured to provide a second data signal to the second sub-pixel;
at least part of the first data line pattern and at least part of the second data line pattern extend along the second direction, and the first data line pattern is located on a first side of a same column of first sub-pixels extending along the second direction, the second data line pattern is located on a second side of a same column of the second sub-pixels extending along the second direction; the first side and the second side is opposite to each other along a first direction, and the first direction intersects the second direction;
the first sub-pixel includes a sixth transistor, and a third conductive connection portion, a fourth conductive connection portion, and an anode pattern stacked in a direction away from the substrate; a second electrode of the sixth transistor is electrically connected to the anode pattern through the third conductive connection portion and the fourth conductive connection portion;

in the first sub-pixel, an orthographic projection of the anode pattern on the substrate at least partially overlaps an orthographic projection of the second data line pattern on the substrate, and the orthographic projection of the anode pattern on the substrate at least partially overlaps an orthographic projection of a data line pattern adjacent to the second data line pattern along the first direction on the substrate;

wherein in the first sub-pixel, the anode pattern does not overlap the first data line pattern.

2. The display substrate according to claim 1, wherein the second sub-pixel includes an another sixth transistor, and an another third conductive connection portion, an another fourth conductive connection portion and an another anode pattern stacked in a direction away from the substrate; a second electrode of the another sixth transistor is electrically connected to the another anode pattern through the another third conductive connection portion and the another fourth conductive connection portion;

in the second sub-pixel, the another fourth conductive connection portion includes a solid portion and a hollow portion;

an orthographic projection of the another anode pattern on the substrate at least partially overlaps an orthographic projection of the first data line pattern on the substrate, and at least partially overlaps the orthographic projection of a data line pattern adjacent to the first data line pattern along the first direction on the substrate;

the orthographic projection of the another anode pattern on the substrate at least partially overlaps the orthographic projection of the second data line pattern on the substrate, and at least partially overlaps an orthographic projection of the solid portion on the substrate and an orthographic projection of the hollow portion on the substrate, respectively.

3. The display substrate according to claim 1, wherein the plurality of sub-pixels further comprise:

a third sub-pixel and a fourth sub-pixel arranged along the second direction; along the first direction, the third sub-pixel and the first sub-pixel are located in a same row, and the fourth sub-pixel and the second sub-pixel are located in an another same row;

the third sub-pixel includes a third data line pattern, the fourth sub-pixel includes a fourth data line pattern, at least part of the third data line pattern and at least part of the fourth data line pattern extend along the second direction, the third data line pattern is located on a second side of a same column of third sub-pixels extending along the second direction, and the fourth data line pattern is located on a first side of a same column of fourth sub-pixels extending along the second direction;

the third sub-pixel includes an another sixth transistor, and an another third conductive connection portion, an another fourth conductive connection portion, and an another anode pattern stacked in a direction away from the substrate; a second electrode of the another sixth transistor is electrically connected to the another anode pattern through the another third conductive connection portion and the another fourth conductive connection portion;

in the third sub-pixel, the another fourth conductive connection portion includes a solid portion and a hollow portion;

an orthographic projection of the another anode pattern on the substrate at least partially overlaps an orthographic projection of the solid portion on the substrate and an orthographic projection of the hollow portion on the substrate, respectively;

the orthographic projection of the another anode pattern on the substrate at least partially overlaps an orthographic projection of the third data line pattern on the substrate, and at least partially overlaps an orthographic projection of a data line pattern adjacent to the third data line pattern along the first direction on the substrate.

4. The display substrate according to claim 3, wherein the fourth sub-pixel includes a yet another sixth transistor, and a yet another third conductive connection portion, a yet another fourth conductive connection portion and a yet another anode pattern stacked in a direction away from the substrate; a second electrode of the yet another sixth transistor is electrically connected to the yet another anode pattern through the yet another third conductive connection portion and the yet another fourth conductive connection portion;

in the fourth sub-pixel, the yet another fourth conductive connection portion includes a solid portion and a hollow portion;

an orthographic projection of the yet another anode pattern on the substrate at least partially overlaps an orthographic projection of the solid portion on the substrate;

the orthographic projection of the yet another anode pattern on the substrate at least partially overlaps with an orthographic projection of the third data line pattern on the substrate, and at least partially overlaps an orthographic projection of a data line pattern adjacent to the third data line pattern along the first direction on the substrate.

5. The display substrate according to claim 4, wherein in the fourth sub-pixel, the orthographic projection of the yet another anode pattern on the substrate does not overlap an orthographic projection of the fourth data line pattern on the substrate.

6. The display substrate according to claim 3, wherein the first sub-pixel, the second sub-pixel, the third sub-pixel and the fourth sub-pixel each include:

a power signal line pattern, at least part of the power signal line pattern extends along the second direction;

a power compensation pattern, at least part of the power compensation pattern extends along the first direction, and the power signal line pattern and the power compensation pattern are both located on a side of the first data line pattern, the second data line pattern, the third data line pattern and the fourth data line pattern close to the substrate, the power compensation pattern is electrically connected to the power signal line pattern and a power signal line pattern in an adjacent sub-pixel along the first direction.

7. The display substrate according to claim 6, wherein the first sub-pixel, the second sub-pixel, the third sub-pixel, and the fourth sub-pixel each include: a reset signal line pattern, a gate line pattern and a light emitting control signal line pattern arranged along the second direction; at least part of the reset signal line pattern extends along the first direction, and at least part of the gate line pattern extends along the first direction, at least part of the light emitting control signal line pattern extends along the first direction;

in the first sub-pixel, the second sub-pixel, the third sub-pixel, and the fourth sub-pixel, an orthographic projection of the power compensation pattern on the substrate is located between an orthographic projection of the gate line pattern on the substrate and an orthographic projection of the light emitting control signal line pattern on the substrate.

8. The display substrate according to claim 6, wherein in the first sub-pixel, the second sub-pixel, the third sub-pixel, and the fourth sub-pixel, the power signal line pattern in each sub-pixel includes: a power main body and a power protruding portion that are electrically connected, at least part of the power protruding portion extends along the second direction, there is a gap between the power protruding portion and the power main body;
   a first end of the power compensation pattern is electrically connected to a power protruding portion in a sub-pixel to which the power compensation pattern belongs; a second end of the power compensation pattern is electrically connected to a power main body in an adjacent sub-pixel along the first direction.

9. The display substrate according to claim 6, wherein in the first sub-pixel, the orthographic projection of a power protruding portion on the substrate overlaps the orthographic projection of the first data line pattern on the substrate, and the orthographic projection of a power main body on the substrate at least partially overlaps an orthographic projection of an adjacent data line pattern along the first direction on the substrate.

10. The display substrate according to claim 6, wherein in the second sub-pixel, the orthographic projection of a power protruding portion on the substrate does not overlap the orthographic projection of the second data line pattern on the substrate.

11. The display substrate according to claim 6, wherein in the third sub-pixel, the orthographic projection of a power protruding portion on the substrate does not overlap the orthographic projection of the third data line pattern on the substrate.

12. The display substrate according to claim 6, wherein in the fourth sub-pixel, the orthographic projection of a power protruding portion on the substrate overlaps the orthographic projection of the fourth data line pattern on the substrate, the orthographic projection of a power main body on the substrate overlaps an orthographic projection of an adjacent data line pattern along the first direction on the substrate.

13. The display substrate according to claim 3, wherein the first sub-pixel, the second sub-pixel, the third sub-pixel and the fourth sub-pixel each include: an initialization signal line pattern, a second transistor, and a second conductive connection portion;
   at least part of the initialization signal line pattern extends along the second direction, and the initialization signal line pattern is used to transmit an initialization signal;
   a first electrode of the second transistor is electrically connected to the initialization signal line pattern through the second conductive connection portion, and a second electrode of the second transistor is electrically connected to a gate electrode of a driving transistor;
   in the first sub-pixel, the orthographic projection of the second conductive connection portion on the substrate overlaps the orthographic projection of the first data line pattern on the substrate;
   in the second sub-pixel, the orthographic projection of the second conductive connection portion on the substrate does not overlap the orthographic projection of the second data line pattern on the substrate;
   in the third sub-pixel, the orthographic projection of the second conductive connection portion on the substrate does not overlap the orthographic projection of the third data line pattern on the substrate;
   in the fourth sub-pixel, the orthographic projection of the second conductive connection portion on the substrate overlaps the orthographic projection of the fourth data line pattern on the substrate.

14. The display substrate according to claim 3, wherein the first sub-pixel, the second sub-pixel, the third sub-pixel, and the fourth sub-pixel each include: an initialization signal line pattern, a shielding pattern, a driving transistor, a second transistor;
   in the first sub-pixel, the second sub-pixel, the third sub-pixel, and the fourth sub-pixel, a first electrode of the second transistor is electrically connected to the initialization signal line pattern, and a second electrode of the second transistor is electrically connected to a gate electrode of the driving transistor;
   the shielding pattern is electrically connected to a power signal line pattern, and an orthographic projection of the shielding pattern on the substrate at least partially overlaps an orthographic projection of the first electrode of the second transistor on the substrate.

15. The display substrate according to claim 14, wherein the first sub-pixel, the second sub-pixel, the third sub-pixel, and the fourth sub-pixel each include: a first conductive connection portion, a fifth conductive connection portion and a data writing transistor;
   in the first sub-pixel, the second sub-pixel, the third sub-pixel, and the fourth sub-pixel, the second electrode of the second transistor is electrically connected to the gate electrode of the driving transistor through the fifth conductive connection portion;
   the first conductive connection portion is electrically connected to a first electrode of the data writing transistor; a second electrode of the data writing transistor is electrically connected to the first electrode of the driving transistor;
   the orthographic projection of the shielding pattern on the substrate at least partially overlaps the orthographic projection of the first conductive connection portion on the substrate.

16. The display substrate according to claim 14, wherein the first sub-pixel, the second sub-pixel, the third sub-pixel, and the fourth sub-pixel each include: a first conductive connection portion;
   in the first sub-pixel, the second sub-pixel, the third sub-pixel, and the fourth sub-pixel, the orthographic projection of at least part of the shielding pattern on the substrate is located between the orthographic projection of the first conductive connection portion on the substrate and the orthographic projection of a fifth conductive connection portion on the substrate.

17. The display substrate according to claim 3, wherein:
   the first sub-pixel, the second sub-pixel, the third sub-pixel, and the fourth sub-pixel each include: a light emitting element, an initialization signal line pattern, a reset signal line pattern, a gate line pattern, and a light emitting control signal line pattern and a power signal line pattern, at least part of the initialization signal line pattern, at least part of the reset signal line pattern, at least part of the gate line pattern and at least part of the light emitting control signal line pattern extend along the first direction, at least part of the power signal line pattern extends along the second direction;

the first sub-pixel, the second sub-pixel, the third sub-pixel, and the fourth sub-pixel further include: a first transistor, a second transistor, a driving transistor, a data writing transistor, a fifth transistor, a sixth transistor, a seventh transistor, and a storage capacitor;

in each sub-pixel, a gate electrode of the driving transistor is electrically connected to a second electrode of the first transistor, a first electrode of the driving transistor is electrically connected to a second electrode of the fifth transistor, a second electrode of the driving transistor is electrically connected to a first electrode of the first transistor;

a gate electrode of the first transistor is electrically connected to the gate line pattern;

a gate electrode of the second transistor is electrically connected to the reset signal line pattern, a first electrode of the second transistor is electrically connected to the initialization signal line pattern, and a second electrode of the second transistor is electrically connected to the gate electrode of the driving transistor;

a gate electrode of the data writing transistor is electrically connected to the gate line pattern, a first electrode of the data writing transistor is electrically connected to the data line pattern included in the sub-pixel, and a second electrode of the data writing transistor is electrically connected to the first electrode of the driving transistor;

a gate electrode of the fifth transistor is electrically connected to the light emitting control signal line pattern, and a first electrode of the fifth transistor is electrically connected to the power signal line pattern;

a gate electrode of the sixth transistor is electrically connected to the light emitting control signal line pattern, a first electrode of the sixth transistor is electrically connected to the second electrode of the driving transistor, and a second electrode of the sixth transistor is electrically connected to the light emitting element;

a gate electrode of the seventh transistor is electrically connected to a reset signal line pattern in an adjacent next sub-pixel along the second direction, and a first electrode of the seventh transistor is connected to an initialization signal line pattern in the adjacent next sub-pixel along the second direction, and a second electrode of the seventh transistor is electrically connected to the light emitting element;

a first electrode plate of the storage capacitor is multiplexed as the gate electrode of the driving transistor, and a second electrode plate of the storage capacitor is electrically connected to the power signal line pattern.

18. A display device comprising the display substrate according to claim 1.

19. A method for manufacturing a display substrate, comprising:

forming a plurality of sub-pixels arranged in an array on a substrate, wherein the plurality of sub-pixels includes: a first sub-pixel and a second sub-pixel arranged along a second direction, the first sub-pixel includes a first data line pattern, and the second sub-pixel includes a second data line pattern, the first data line pattern is configured to provide a first data signal to the first sub-pixel, and the second data line pattern is configured to provide a second data signal to the second sub-pixel;

at least part of the first data line pattern and at least part of the second data line pattern extend along the second direction, and the first data line pattern is located on a first side of a same column of first sub-pixels extending along the second direction, the second data line pattern is located on a second side of a same column of the second sub-pixels extending along the second direction; the first side and the second side is opposite to each other along a first direction, and the first direction intersects the second direction;

the first sub-pixel includes a sixth transistor, and a third conductive connection portion, a fourth conductive connection portion, and an anode pattern stacked in a direction away from the substrate; a second electrode of the sixth transistor is electrically connected to the anode pattern through the third conductive connection portion and the fourth conductive connection portion;

in the first sub-pixel, an orthographic projection of the anode pattern on the substrate at least partially overlaps an orthographic projection of the second data line pattern on the substrate, and the orthographic projection of the anode pattern on the substrate at least partially overlaps an orthographic projection of a data line pattern adjacent to the second data line pattern along the first direction on the substrate;

wherein in the first sub-pixel, the anode pattern does not overlap the first data line pattern.

* * * * *